(12) United States Patent
Ohashi et al.

(10) Patent No.: US 12,345,517 B2
(45) Date of Patent: Jul. 1, 2025

(54) MEASURING DEVICE, EXPOSURE DEVICE, AND MEASUREMENT METHOD

(71) Applicant: NIKON CORPORATION, Tokyo (JP)

(72) Inventors: Michio Ohashi, Tokyo (JP); Satoshi Takahashi, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 163 days.

(21) Appl. No.: 17/917,584

(22) PCT Filed: Apr. 13, 2020

(86) PCT No.: PCT/JP2020/016332
§ 371 (c)(1),
(2) Date: Oct. 7, 2022

(87) PCT Pub. No.: WO2021/210052
PCT Pub. Date: Oct. 21, 2021

(65) Prior Publication Data
US 2023/0152083 A1 May 18, 2023

(51) Int. Cl.
*G01B 11/00* (2006.01)

(52) U.S. Cl.
CPC .................. *G01B 11/002* (2013.01)

(58) Field of Classification Search
CPC ..... G01B 11/002; G01B 11/022; G01B 11/03; G01B 11/2518; G01B 2210/56; G03F 9/7046; G03F 9/7065; G03F 9/7088; G03F 9/7076; G01N 21/4788
See application file for complete search history.

(56) References Cited

U.S. PATENT DOCUMENTS

| | | | |
|---|---|---|---|
| 6,313,916 B1 | 11/2001 | Inada | |
| 6,421,123 B1 | 7/2002 | Shiraishi | |
| 10,120,294 B2 | 11/2018 | Tsujikawa | |
| 2005/0117140 A1 | 6/2005 | Mishima | |

(Continued)

FOREIGN PATENT DOCUMENTS

| | | |
|---|---|---|
| EP | 0 573 299 B1 | 9/1999 |
| EP | 1755152 A1 | 2/2007 |
| JP | 2001-338871 A | 12/2001 |

(Continued)

OTHER PUBLICATIONS

Nov. 14, 2023 Office Action issued in Japanese Patent Application No. 2022-514887.

(Continued)

*Primary Examiner* — Peter B Kim
(74) *Attorney, Agent, or Firm* — Oliff PLC

(57) ABSTRACT

A measuring device includes an illumination system configured to radiate light to a measuring target object located on an object plane, an image formation system configured to form a conjugate plane optically conjugated with the object plane, a diffracted light restricting part configured to restrict at least some of a plurality of rays of diffracted light from the measuring target object and to pass a first diffracted light and a second diffracted light different from the first diffracted light among the plurality of rays of diffracted light, and an imaging part disposed on the conjugate plane and configured to image a periodic light and dark pattern formed by the first diffracted light and the second diffracted light.

17 Claims, 10 Drawing Sheets

(56) References Cited

U.S. PATENT DOCUMENTS

2015/0261097 A1\* 9/2015 Mathijssen ......... G03F 7/70141
　　　　　　　　　　　　　　　　　　　　355/67
2019/0204180 A1\* 7/2019 Medvedyeva .......... G03F 7/705

FOREIGN PATENT DOCUMENTS

| JP | 2017-102265 A | 6/2017 |
| TW | 201940983 A | 10/2019 |
| WO | 2017/140528 A1 | 8/2017 |

OTHER PUBLICATIONS

Nov. 27, 2023 Search Report issued in European Patent Application No. 20931549.8.
Jul. 28, 2020 International Search Report issued in International Patent Application No. PCT/JP2020/016332.
Jul. 28, 2020 Written Opinion issued in International Patent Application No. PCT/JP2020/016332.
Dec. 17, 2024 Office Action issued in Japanese Patent Application No. 2024-059315.
Aug. 16, 2024 Search Report issued in European Patent Application No. 20931549.8.
Aug. 30, 2024 Office Action issued in Taiwanese Patent Application No. 110112863.
Mar. 17, 2025 Office Action issued in Chinese Patent Application No. 202080099368.1.

\* cited by examiner

MEASURING DEVICE, EXPOSURE DEVICE, AND MEASUREMENT METHOD

TECHNICAL FIELD

The present invention relates to a measuring device, an exposure device, and a measurement method.

BACKGROUND ART

In an exposure technology of exposing a light and dark pattern on a photosensitive substrate, a position of an existing pattern previously formed on the photosensitive substrate prior to exposure of the light and dark pattern is measured, the position is matched to the existing pattern, and the light and dark pattern is exposed on the photosensitive substrate. For a measurement of a position of an existing pattern, a method of measuring the position of the existing pattern by imaging an image of an alignment mark in the existing pattern with a position measurement optical system is used (see Patent Literature 1).

CITATION LIST

Patent Literature

[Patent Literature 1]
U.S. patent Ser. No. 10/120,294

SUMMARY OF INVENTION

Solution to Problem

According to a first aspect, a measuring device includes an illumination system configured to radiate light to a measuring target object located on an object plane; an image formation system configured to form a conjugate plane optically conjugated with the object plane; a diffracted light restricting part configured to restrict at least some of a plurality of rays of diffracted light from the measuring target object and to pass first diffracted light and second diffracted light different from the first diffracted light among the plurality of rays of diffracted light; and an imaging part disposed on the conjugate plane and configured to image a periodic light and dark pattern formed by the first diffracted light and the second diffracted light.

According to a second aspect, a measuring device includes an illumination system configured to radiate light with a plurality of wavelengths to a measuring target object located on an object plane; an image formation system configured to form a conjugate plane optically conjugated with the object plane: a diffracted light passing part configured to pass first diffracted light and second diffracted light different from the first diffracted light among a plurality of rays of diffracted light from the measuring target object; and an imaging part disposed on the conjugate plane and configured to image a light and dark pattern formed by the light with the plurality of wavelengths passed through the diffracted light passing part.

According to a third aspect, an exposure device includes the measuring device of the first or second aspect; and an exposure optical system configured to radiate exposure light to a substance including the measuring target object.

According to a fourth aspect, an exposure device using the measuring device according to the first or second aspect measures a position of a mark having a periodic structure.

BRIEF DESCRIPTION OF DRAWINGS

FIG. 2($c$) is a view showing an image of a mark of FIG. 2($a$) which is formed on an imaging surface of an imaging part of a measuring device.

FIG. 4($b$) is a view showing an example of a diffracted light restricting part.

FIG. 6($b$) is a view showing an example of a size of a selection opening provided in a diffracted light restricting part.

FIG. 7($b$) is a view showing an example of a diffracted light limiting diaphragm of Variant 1 of the measuring device.

DESCRIPTION OF EMBODIMENTS

In the specification, "optically conjugate" means that one plane and another plane form an image formation relation via an optical system.

An X direction, a Y direction and a Z direction shown with arrows in each drawing referred to below are directions perpendicular to each other, and each of the X direction, the Y direction and the Z direction indicates the same direction in each drawing.

Hereinafter, the directions shown by the arrows are referred to as a +X direction, a +Y direction and a +Z direction.

In addition, a position in the X direction is referred to as an X position, a position in the Y direction is referred to as a Y position, and a position in the Z direction is referred to as a Z position.

(Measuring device of first embodiment)

Figure 1:
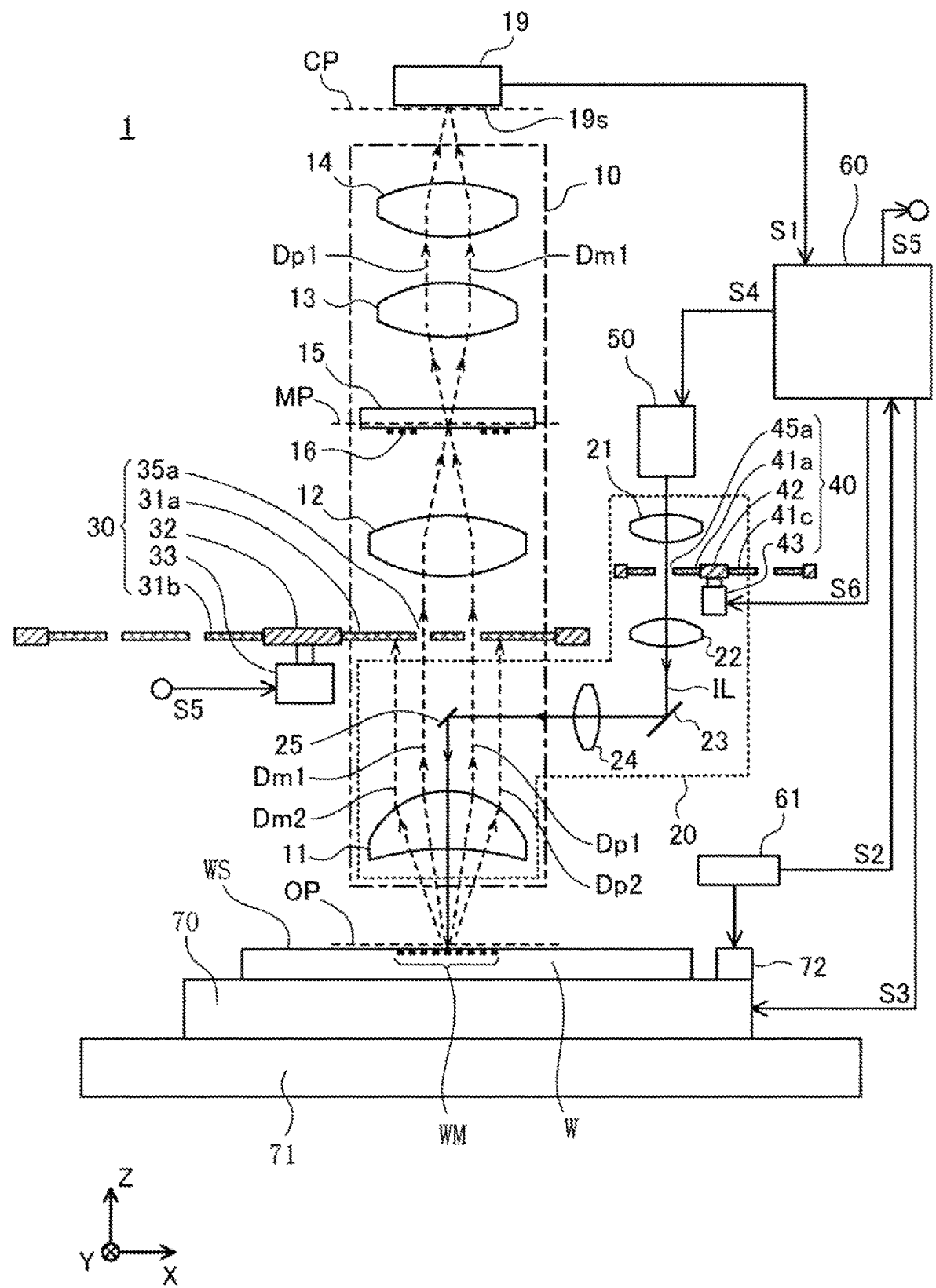
FIG. 1 is a view schematically showing a configuration of a measuring device of a first embodiment.

FIG. 1 is a view schematically showing a configuration of a measuring device 1 of a first embodiment. A measuring target object W is placed on a sampling stage 70 such that a surface WS, which is a surface on a +Z side of the measuring target object W such as a silicon wafer or the like serving as a measurement object, approximately coincides with an object plane OP of an image formation system 10. The sampling stage 70 is supported by a guide 71 movably in the X direction and the Y direction, the measuring target object W is also movable in the X direction and the Y direction, and the X position and the Y position of the measuring target object W are measured by an encoder 61 via a position of a scale board 72 provided on the sampling stage 70 and transmitted to a control part 60 as a position signal S2.

The image formation system 10 has an objective lens 11, a first relay lens 12, a second relay lens 13, and a third relay lens 14, and a conjugate plane CP optically conjugated with respect to the object plane OP is formed. An imaging pan 19 such as a CMOS image sensor or the like is disposed on the conjugate plane CP such that an imaging surface 19s of the imaging part 19 coincides with the conjugate plane CP A measurement mark W M that is a target for position measurement is formed on the surface WS of the measuring target object W, and the image formation system 10 forms an image of the measuring target object W including the measurement mark WM on the imaging surface 19s of the imaging part 19.

The image formation system 10 has an intermediate image formation surface MP, on which an intermediate image of the measuring target object W is formed, between the first relay lens 12 and the second relay lens 13, i.e., also between the object plane OR on which the measuring target object W is disposed, and the conjugate plane CP. An index board 15 formed of a transparent substrate is provided on the intermediate image formation surface MP and a position index 16 is provided on a part of the index board 15.

The position index 16 has, as an example, light shielding films having a rectangular shape, which are periodically disposed on the index board 15. With respect to a center of an optical path of the image formation system 10, the position index 16 in which the light shielding films are periodically disposed in the X direction on both sides in the X direction is disposed, and the position index 16 in which the light shielding films are periodically disposed in the Y direction on both sides in the Y direction is provided.

The position index 16 is illuminated with light from an index illumination system (not shown) provided in the image formation system 10, and an image of the position index 16 is formed on the conjugate plane CP by the second relay lens 13 and the third relay lens 14. The imaging part 19 also images an image of the position index 16 together with the image of the measurement mark WM formed on the conjugate plane CP.

An illumination system 20 includes relay lenses 21, 22 and 24, an illumination opening changing part 40, a mirror 23, a divergence mirror 25, and the objective lens 11, and illumination light IL supplied from a light source part 50 is radiated to the surface WS of the measuring target object W which is disposed on the object plane OP and which includes the measurement mark WM. Among these, the objective lens 11 is included in both of the image formation system 10 and the illumination system 20.

The illumination light IL supplied from the light source part 50 passes through the relay lens 21 that constitutes the illumination system 20, and a numerical aperture thereof is defined by an illumination opening diaphragm 41a included in the illumination opening changing part 40. The illumination opening changing part 40 will be described below in detail.

The illumination light IL passing through the illumination opening changing part 40 reaches the divergence mirror 25 after passing the relay lens 21, the mirror 23 and the relay lens 24.

The divergence mirror 25 is, for example, a mirror that reflects light in a part of its plane and transmits light in another part, and for example, a mirror in which a reflection film is formed on a part of a transparent plate.

The illumination light passing through the relay lens 24 is reflected by the divergence mirror 25, and passes through the objective lens 11 to be radiated to the measuring target object W including the measurement mark WM.

Further, in FIG. 1, while each lens such as the objective lens 11 or the like is shown as being constituted by a sheet of lens, each lens may be constituted by a plurality of lenses.

FIG. 2(a) is a view showing in a +Z direction an example of the measurement mark WM appropriate for measurement at a position in the X direction, which is fonned on the surface WS of the measuring target object W. FIG. 2(b) is a cross-sectional view showing the measurement mark WM shown in FIG. 2(a) in a -Y direction.

Further, an example of a measurement mark appropriate for measurement at a position in the Y direction is provided by rotating the measurement mark WM 90° in an XY plane.

The measurement mark WM is, for example, a mark on which depressed sections MB and raised sections MT having a step difference are alternately periodically formed on the surface WS of the measuring target object W in the X direction. One depressed section MB has a rectangular shape elongated in the Y direction, each side of which is parallel to the X direction or the Y direction, and the plurality of depressed sections MB are periodically formed at a period PX in the X direction. For this reason, the measurement mark WM functions as a reflective type diffraction grating having a periodic structure in the X direction. Further, the number of the depressed sections MB periodically disposed in the X direction may be an arbitrary number of two or more.

As shown in FIG. 2(b), the surface WS of the measuring target object W including the measurement mark WM is covered with a film RS containing photoresist or the like and having translucency or half translucency.

A width of the depressed section MB and the raised section MT in the X direction is, for example, about 1 to 3 μm, and the period PX of the arrangement in the X direction is, for example, about 2 to 4 μm.

The measurement mark WM is formed at a predetermined position on the measuring target object W in terms of design. However, since the measuring target object W such as a silicon wafer or the like is isotropically or anisotropically deformed by a semiconductor process or the, like, the actual position of the measurement mark WM is different from the design position.

In position measurement, first, the control part 60 transmits a control signal S3 on the basis of the position signal S2 from the encoder 61 to move the sampling stage 70, and causes the design position of the measurement mark WM to coincide with a measurement reference position of the image formation system 10.

Accordingly, the illumination light IL is radiated to the measuring target object. W, and as shown in FIG. 1, a plurality of rays of diffracted light such as $+1^{st}$ order diffracted light Dp1, $-1^{st}$ order diffracted light Dm1, $+2^{nd}$ order diffracted light Dp2, $-2^{nd}$ order diffracted light Dm2, and the like, from the measurement mark WM are generated by a periodic structure of the measurement mark WM in the X direction. The generated diffracted light enters the objective lens 11 and is guided to the divergence mirror 25.

Then, the plurality of rays of diffracted light (Dm2, Dm1, Dp1, Dp2) pass through the divergence mirror 25, and reach a diffracted light limiting diaphragm 31a provided on pupil surface in the image formation system 10 or the vicinity thereof. Accordingly, diffracted light of different orders generated at different diffraction angles from the measurement mark WM disposed on the object plane OP is condensed at different positions on the diffracted light limiting diaphragm 31a. Further, in the example shown in FIG. 1, 0 order diffracted light that is regular reflection light from the measurement mark WM does not reach the diffracted light limiting diaphragm 31a because it is blocked by the divergence mirror 25.

In the diffracted light limiting diaphragm 31a, a selection opening 35a is provided at a position where diffracted light of a predetermined order is condensed in an attenuation region where light is attenuated, the diffracted light of the predetermined order passes therethrough, and diffracted light of another order is attenuated. Here, the diffracted light of the other order may be blocked, in addition, light transmissivity (light transmittance) of the selection opening 35a may not be 100%. The light transmissivity of the selection opening 35a is higher than light transmittance of the attenuation region. In a state shown in FIG. 1, the selection opening 35a selectively passes +$1^{st}$ order diffracted light Dp1 and −$1^{st}$ order diffracted light Dm1 in the X direction, and blocks diffracted light of other orders (+$1^{st}$ order diffracted light Dp2, −$2^{nd}$ order diffracted light Dm2, and the like). A diffracted light restricting part 30 including the diffracted light limiting diaphragm 31a will be described below in detail.

The +1' order diffracted light Dp1 and the −$1^{st}$ order diffracted light Dm1 selectively passed by the diffracted light limiting diaphragm 31a are condensed by the first relay lens 12, and an intermediate image of the measurement mark W M is formed as an interference fringe in the vicinity of the index board 15 disposed on the intermediate image formation surface MP. Then, the +$1^{st}$ order diffracted light Dp1 and the −$1^{st}$ order diffracted light Dm1 are condensed by the second relay lens 13 and the third relay lens 14, and an image of the measurement mark WM is formed as an interference fringe on an imaging surface of the imaging part 19.

FIG. 2(c) is a view showing an example of an intensity distribution of an image IM of the measurement mark WM formed on the imaging surface 19s. A lateral axis of a graph of the intensity distribution shown in FIG. 2(c) shows a position on the imaging surface 19s in the X direction, and a vertical axis shows intensity of the image IM. In addition, intensity distributions of images IIL and IIR of the position index 16 on the index board 15 are shown on a −X side and a +X side of the image IM of the measurement mark WM.

The image IM of the measurement mark WM shown in FIG. 2(c) is obtained by enlarging the measurement mark WM shown in FIG. 2(a) and FIG. 2(b) by an image formation magnification (lateral magnification) of the image formation system 10 in the X direction. However, hereinafter, for the purpose of easy understanding, it will be explained assuming that the image formation system 10 has a lateral magnification of 1. Further, note that the scale of FIG. 2(c) in the X direction does not coincide with the scale of FIG. 2(a) and FIG. 2(b) in the X direction.

The image IM of the measurement mark WM is an interference fringe formed by the +$1^{st}$ order diffracted light Dp1 and the −$1^{st}$ order diffracted light Dm1 from the measurement mark WM interfering with each other. Accordingly, a periodic light and dark pattern is formed in the X direction over one period or longer, and a light and dark period in the X direction is ½ of the period PX of the measurement mark WM in the X direction. Further, the light and dark pattern may be referred to as a light and dark image.

The imaging part 19 images the image IM over an imaging range DA of one light and dark period or longer of the image IM of the measurement mark WM in the X direction, and transmits an imaging signal S1 to the control part 60. A range in the X direction of the imaging range DA may be an integer times of ½ of the period PX, i.e., n×PX/2 (n is a natural number).

The imaging part 19 or the control pan 60 may integrate the imaging signal S1 of the image IM in the imaging range DA in the Y direction. In addition, as described below, when a position of the measurement mark WM or the like in the Y direction is measured, the imaging part 19 or the control part 60 may integrate the imaging signal S1 of the image IM in the X direction in the imaging range DA.

A width in the X direction and a width in the Y direction of the imaging range DA may be variably set by the imaging part 19 or the control part 60. By changing the width in the X direction and the width in the Y direction of the imaging range DA, various types of the measurement marks WM, WMa and WMb can be measured, and it is possible to reduce a bad influence due to a circuit pattern or the like disposed around the measurement marks WM. WMa and WMb.

Similarly, the imaging part 19 also images the images IIL and IIR of the position index 16, and transmits the imaging signal S1 to the control part 60.

The control part 60 measures an actual position of the measurement mark WM on the basis of the transmitted imaging signal S1.

As described above, the measurement mark WM for measurement is disposed such that a design position thereof coincides with a measurement reference position of the image formation system 10. Accordingly, the actual position of the measurement mark WM can be measured by measuring the positional shift amount from the measurement reference position of the image formation system 10 of the measurement mark WM and by adding the positional shift amount to the design position of the measurement mark WM.

The measurement reference position of the image formation system 10 is, for example, a position where an image such as the measurement mark WM or the like disposed at the measurement reference position is formed in the middle of the images IIL and IIR of the two position indices 16 in the imaging surface 19s.

The control part 60 determines, on the basis of, for example, a phase of a light and dark change in the X direction of the images IIL and IIR of the two position indices 16, positions of the images IIL and IIR in the X direction and determines measurement reference positions of the image formation system 10 in the X direction, which are intermediate positions of the images IIL and IIR.

The control part 60 determines a position of the image IM in the X direction and calculates a positional shift amount from a measurement reference position of the image formation system 10 in the X direction, on the basis of, for example, a phase of a light and dark change in the X direction of the image IM of the measurement mark WM. Then, an actual X position of the measurement mark WM is calculated (measured) by adding the positional shift amount to the designed X position of the measurement mark WM, which is already known.

While the measurement of the X position of the measurement mark WM has been described above, measurement of the Y position can also be performed similarly. In measurement of the Y position, as described above, the measurement mark WM obtained by rotating the measurement mark WM shown in FIG. 2(a) 90° in the XY plane on the measuring target object W is measured. In this case, a periodic light and dark changing image in the Y direction is formed on the imaging surface 19s, and the control part 60 calculates (measures) an actual Y position of the measurement mark WM, on the basis of a positional relation between the formed periodic light and dark changing image and an image of the position index 16, and the designed Y position of the measurement mark WM.

Further, as described above, when performing the position measurement of the measurement mark WM, the design position of the measurement mark WM is matched with the measurement reference position of the image formation system 10, however, the design position of the measurement mark WM may not completely coincide with the measurement reference position of the image formation system 10. In this case, the control part 60 may measure the positional shift amount from the measurement reference position of the image formation system 10 at the design position of the measurement mark WM during measurement by using the position signal S2 from the encoder 61, and calculate (measure) an actual position of the measurement mark. WM by further adding the positional shift amount.

Figure 3:
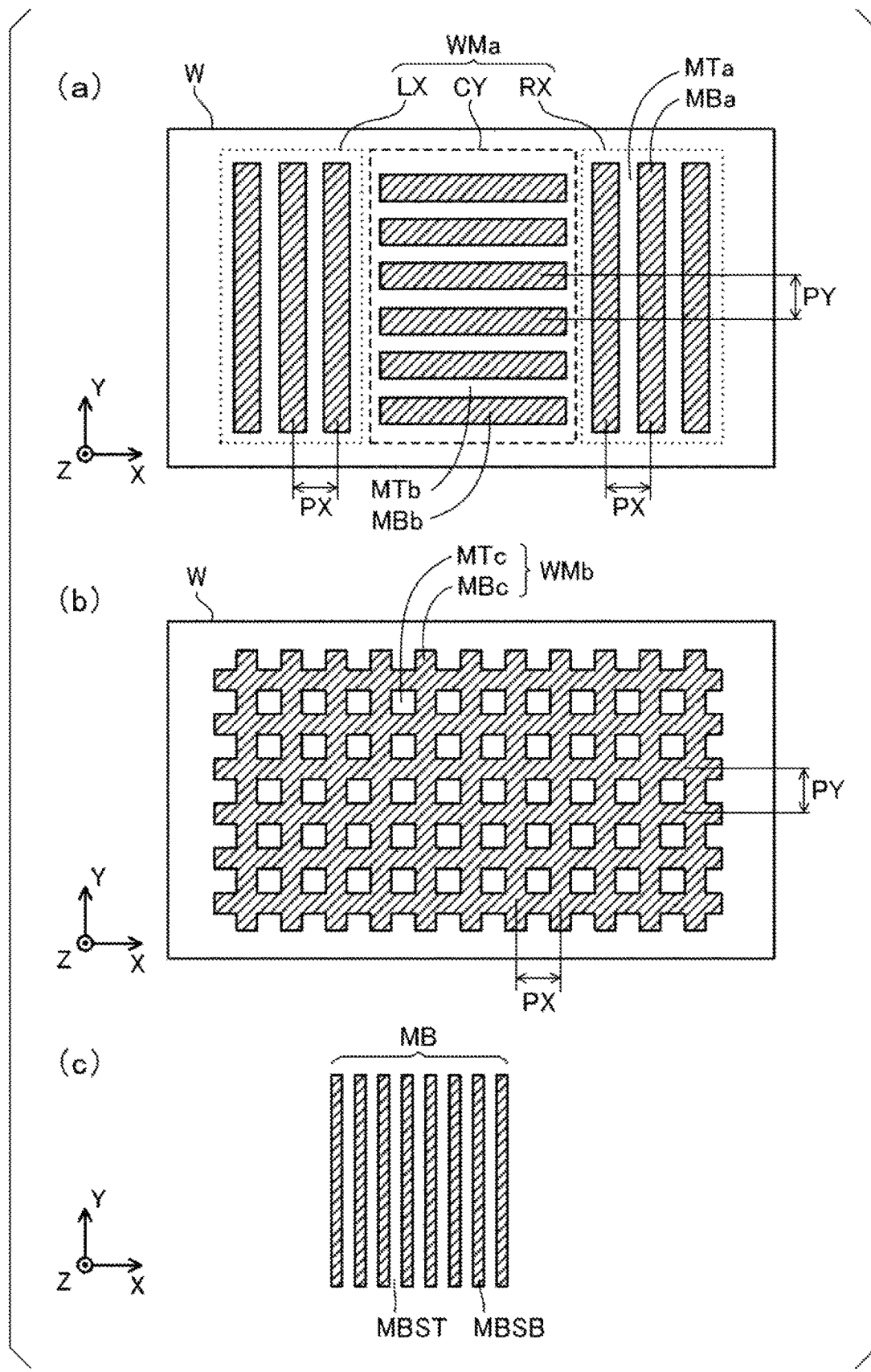
FIG. 3 is a view showing another example of the position measurement mark appropriate for the measuring device of the first embodiment.

FIG. 3 is a view showing another example of the measurement mark WM.

Figure 2:
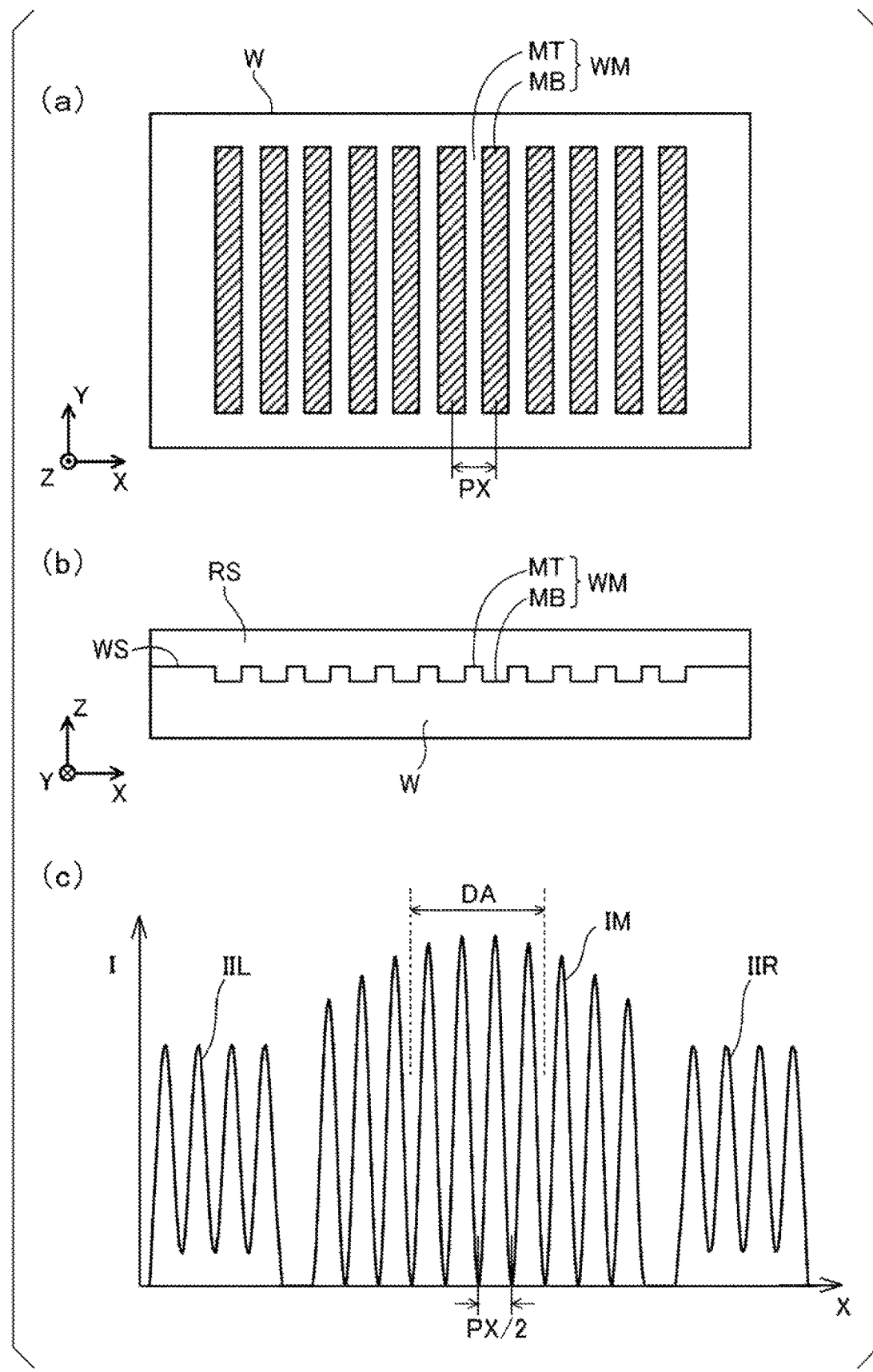
FIG. 2($a$) and FIG. 2($b$) are views showing an example of a position measurement mark appropriate for the measuring device of the first embodiment.

The measurement mark WMa shown in FIG. 3(*a*) is distinguished from the measurement mark WM shown in FIG. 2(*a*) in that several depressed sections MB in the vicinity of the center in the X direction is rotated by 90° in the XY plane. A –X side end portion LX and a +X side end portion RX of the measurement mark WMa have the depressed section MBa and the raised section MTa extending in the X direction appropriate for position measurement in the X direction. Meanwhile, a central portion CY of the measurement mark WMa in the X direction has the depressed section MBb and the raised section MTb extending in the Y direction appropriate for position measurement in the Y direction.

Accordingly, the measuring device 1 can perform the measurement of the position in the X direction and the measurement of the position in the Y direction of the measurement mark WMa together.

Further, a period PY of disposition of the depressed section MBb and the raised section MTb of the central portion CY in the Y direction may be the same as or different from the period PX of the depressed section MBa and the raised section MTa of the –X side end portion LX and the +X side end portion RX in the X direction.

The number of the depressed sections MBa included in the central portion CY and the number of the depressed sections MB included in the –X side end portion LX and the +X side end portion RX may be an arbitrary number such as two or more.

The measurement mark WMb shown in FIG. 3(*b*) is a mark including the depressed section MBc formed in a two-dimensional lattice shape and the raised section MTc surrounded thereby. Since the two-dimensional lattice which the depressed section MBc forms includes both the periodicity in the X direction in the periodicity in the Y direction, the measuring device 1 can perform both the measurement of the position in the X direction and the measurement of the position in the Y direction of the measurement mark WMb.

Further, in each of the above-mentioned measurement marks WM, WMa and WMb, one of the depressed sections MB, MBa and MBb may be subdivided, for example, in a direction to be measured.

FIG. 3(*c*) is a view showing an example of one of the subdivided depressed sections MB. The one depressed section MB shown in FIG. 3(*c*) is constituted by a plurality of micro depressed sections MBSB and a plurality of micro raised sections MBST, which are subdivided in the X direction.

When the depressed section MBa appropriate for measurement in the Y direction is subdivided, the inside thereof may be subdivided in the Y direction.

When the depressed section MBb appropriate for the measurement in both the X direction and the Y direction is subdivided, the inside may be subdivided in the X direction, may be subdivided in the Y direction, or may be two-dimensionally subdivided in the X direction and the Y direction.

In these cases, a width of the one micro depressed section MBb in the X direction (or the Y direction) is, for example, about 0.05 to 0.3 µm, and a period of disposition of a plurality of micro depressed sections MBB that constitute the depressed section MB in the X direction (or the Y direction) is about 0.1 to 0.5 sm.

Further, instead of one depressed section MB, one of the raised sections MT, MTa and MTb may be a mark subdivided as described above.

Further, the measurement marks WM, WMa and WMb are not limited to the shape with the above-mentioned step difference, and may be marks having a difference in amplitude reflection coefficient between the depressed sections MB, MBa and MBb and the raised sections MT, MTa and MTb.

In the measuring device 1 of the first embodiment, upon measurement of positions of the various the measurement marks WM, WMa and WMb (hereinafter, generally and simply referred to as "the measurement mark WM") as described above, the image by the diffracted light appropriate for each measurement is imaged to perform position measurement.

For this reason, the measuring device 1 of the first embodiment includes the diffracted light restricting part 30 configured to attenuate at least some of the plurality of rays of diffracted light generated from the measurement mark WM, and configured to cause a first diffracted light (for example, the +1$^{st}$ order diffracted light Dp1) and a second diffracted light (for example, the –1$^{st}$ order diffracted light Dm1) different from the first diffracted light to pass therethrough.

Hereinafter, the diffracted light restricting part 30 and the illumination opening changing part 40 included in the illumination system 20 will be described with reference to FIG. 1 and FIG. 4.

Figure 4:
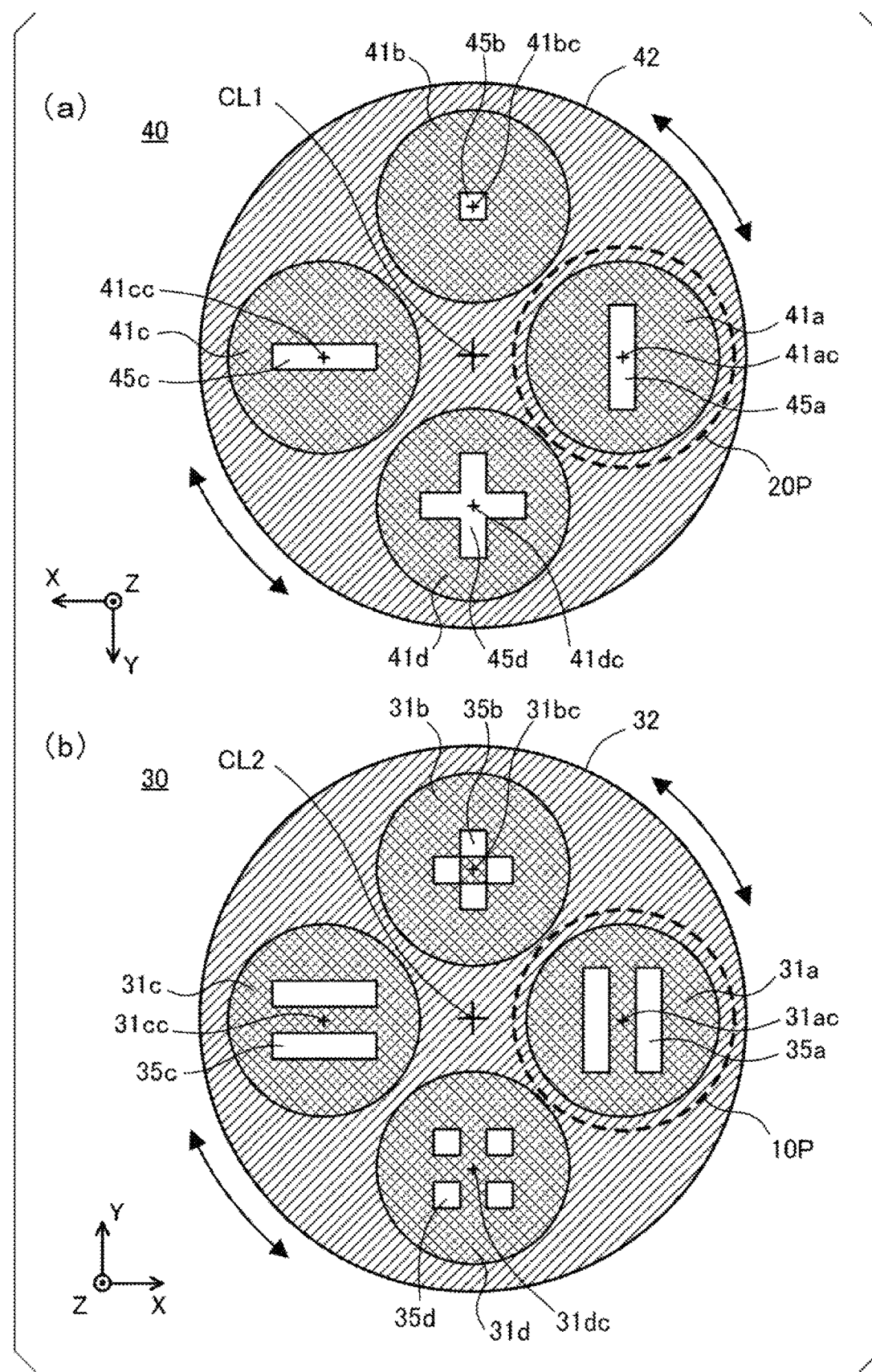
FIG. 4($a$) is a view showing an example of an illumination opening changing part in an illumination system.

FIG. 4(*b*) is a view showing the diffracted light restricting part 30 in the +Z direction. As shown in FIG. 1 and FIG. 4(*b*), the diffracted light restricting part 30 has diffracted light limiting diaphragms 31*a* to 31*d*, an image formation diaphragm holding part 32, and a selection switching part 33. The image formation diaphragm holding part 32 is held by the selection switching part 33 to be rotatable about a rotation center CL2 as a center.

For example, the image formation diaphragm holding part 32 holds the four diffracted light limiting diaphragms 31*a* to 31*d*, and inserts one of them into an image formation optical path 10P of the image formation system 10.

Selection openings 35*a* to 35*d* having different shapes are formed in the diffracted light, limiting diaphragms 31*a* to 31*d*. The diffracted light restricting part 30 can select diffracted light passing through the selection openings 35*a* to 35*d* by inserting any one of the diffracted light limiting diaphragms 31*a* to 31*d* into the image formation optical path 10P.

FIG. 4(a) is a view showing the illumination opening changing part 40 in the +Z direction. As shown in FIG. 1 and FIG. 4(a), the illumination opening changing part 40 has illumination opening diaphragms 41a to 41d, an illumination diaphragm holding part 42, and an illumination switching part 43. The illumination diaphragm holding part 42 is held by the illumination switching part 43 to be rotatable about a rotation center CL1 as a center.

For example, the illumination diaphragm holding part 42 holds the four illumination opening diaphragms 41a to 41d, and one of them is inserted into an illumination optical path 20P of the illumination system 20.

Transmission openings 45a to 45d having different shapes are provided in the illumination opening diaphragms 41a to 41d. The illumination opening changing part 40 can select an illumination condition such as a numerical aperture of illumination light passing through the transmission openings 45a to 45d and radiated to the measuring target object W by inserting any one of the illumination opening diaphragms 41a to 41d into the illumination optical path 20P.

Further, the numerical aperture of the illumination light is a sine (sin) of a half angle of an incidence angle range of the illumination light radiated to the measuring target object W. A value obtained by dividing the numerical aperture of the illumination light by a numerical aperture (NA) of the objective lens 11 is a value generally referred to as a coherence factor.

Further, the illumination opening diaphragms 41a to 41d are disposed on the pupil surface or the vicinity thereof by lenses 22 and 24, the objective lens 11, and the like, with respect to the object plane OP. Accordingly, the illumination light passing through each of the transmission openings 45a to 45d in the illumination opening diaphragms 41a to 41d enters the measurement mark WM disposed on the object plane OP at an incidence angle corresponding to positions of the transmission openings 45a to 45d.

In addition, as described above, the diffracted light limiting diaphragms 31a to 31d are provided on the pupil surface or the vicinity thereof in the image formation system 10. Accordingly, the illumination opening diaphragms 41a to 41d inserted into the illumination optical path 20P and the diffracted light limiting diaphragms 31a to 31d inserted into the image formation optical path 10P have an image formation relation via the lenses 22 and 24, the objective lens 11, and the measuring target object W as reflection surfaces disposed on the object plane OP.

Further, a positional relation between the diffracted light limiting diaphragms 31a to 31d and the illumination opening diaphragms 41a to 41d in the X direction and the Y direction is inverted by an image formation action of the lenses 22 and 24 in the illumination system 20. Here, for easy understanding of the image formation relation between the diffracted light limiting diaphragms 31a to 31d and the illumination opening diaphragms 41a to 41d, the X direction and the Y direction of FIG. 4(a) are shown inverted (i.e., rotated by 180°) with respect to FIG. 4(b).

For example, when the measurement mark WM having periodicity in the X direction shown in FIG. 2(a) is measured, the illumination opening changing part 40 inserts the illumination opening diaphragm 41a into the illumination optical path 20P, and the diffracted light restricting part 30 inserts the diffracted light limiting diaphragm 31a into the image formation optical path 10P. This state is a state shown in FIG. 4(a) and FIG. 4(b), a center 41ac of the illumination opening diaphragm 41a is disposed to coincide with a center of the illumination optical path 20P, and a center 31ac of the diffracted light limiting diaphragm 31a is disposed to coincide with a center of the image formation optical path 10P.

A transmission opening 45a provided in the illumination opening diaphragm 41a has a small width in the X direction, and a width in the Y direction is greater than the width in the X direction. Accordingly, the illumination light IL radiated to the measurement mark WM enters within a narrow incidence angle range in the X direction, and enters within a wide incidence angle range in the Y direction.

For example, a range of the incidence angle in the X direction to the measurement mark WM of the illumination light IL passing through the transmission opening 45a is 0 or more and ⅓ or less as the above-mentioned coherence factor.

As shown in FIG. 1, the plurality of rays of diffracted light (Dm2, Dm1, Dp1, Dp2) are generated from the measurement mark WM by radiation of the illumination light IL. The selection opening 35a of the diffracted light limiting diaphragm 31a of the diffracted light restricting part 30 passes the $+1^{st}$ order diffracted light Dp1 and the $-1^{st}$ order diffracted light Dm1 among them, and blocks the other rays of diffracted light (Dm2, Dp2, and the like). Accordingly, only the $+1^{st}$ order diffracted light Dp1 and the $-1^{st}$ order diffracted light Dm1 appropriate for detection of the measurement mark WM in the X direction reach the imaging surface 19s of the imaging part 19, and forms the image IM of the measurement mark WM.

Further, a distance of the two selection openings 35a from the center 31ac of the diffracted light limiting diaphragm 31a in the X direction is set to become a position where the selection opening 35a passes the $+1^{st}$ order diffracted light Dp1 and the $-1^{st}$ order diffracted light Dm1 from the measurement mark WM. In addition, a width of each of the two selection openings 35a in the X direction is set to a width through which the $+1^{st}$ order diffracted light Dp1 and the $-1^{st}$ order diffracted light Dm1 from the measurement mark WM can pass.

The above-mentioned relation with respect, to the position and width from the center 31ac of the diffracted light limiting diaphragm 31a of the selection opening 35a is the same as that of the distance and width from the centers 31be to 31de of the diffracted light limiting diaphragms 31b to 31d of the other selection openings 35b to 35d.

In addition, according to the width of the transmission opening 45a of the illumination opening diaphragm 41a in the X direction, the diffracted light of each order is distributed in the diffracted light limiting diaphragm 31a in the X direction. Accordingly, the width of the transmission opening 45a of the illumination opening diaphragm 41a in the X direction may be set to a width such that the $+1^{st}$ order diffracted light Dp1 and the $-1^{st}$ order diffracted light Dm1 in the diffracted light limiting diaphragm 31a can be separated from the rays of diffracted light of the other orders.

Further, in the measuring device in the related art, the position of the measurement mark is measured on the basis of the image including not only the $+1^{st}$ order diffracted light Dp1 and the $-1^{st}$ order diffracted light Dm1 but also the rays of diffracted light of the other orders. Then, since the diffracted light of each order passes through different positions in the image formation system, different amounts of wave aberrations are received from the image formation system. In this case, for example, when a shape of the measurement mark WM fluctuates and a ratio of the intensity of the diffracted light of each order also fluctuates, the image IM of the measurement mark W M is deformed or displaced due to an influence of the wave aberration of the image formation system, and an error occurs in the position measurement result.

In the measuring device 1 of the first embodiment, since the image IM of the measurement mark WM is formed by selectively pass the first diffracted light (the $+1^{st}$ order diffracted light Dp1 or the like) and the second diffracted light (the $-1^{st}$ order diffracted light Dm1 or the like) among the plurality of rays of diffracted light by using the diffracted light limiting diaphragm 31a, it is less likely to be easily affected by the wave aberration of the image formation system 10, and it is possible to perform accurate position measurement.

In addition, since the image IM of the measurement mark WM is formed by the first diffracted light and the second diffracted light, it is difficult to decrease a contrast of the image IM even when fluctuation (defocusing) at the position of the measurement mark WM in the Z direction occurs, and it is possible to measure the measurement mark WM at a deep focal depth.

Further, when the measurement mark WM appropriate for measurement in the Y direction obtained by rotating the measurement mark WM shown in FIG. 2(a) by 90' in the XY plane is measured, an illumination opening diaphragm 41c is inserted into the illumination optical path 20P such that a center 41cc of the illumination opening diaphragm 41c coincides with a center of the illumination optical path 20P. Then, a diffracted light limiting diaphragm 31c is inserted into the image formation optical path 10P such that a center 31cc of the diffracted light limiting diaphragm 31c coincides with a center of the image formation optical path 10P.

A transmission opening 45c having a shape obtained by rotating the transmission opening 45a provided in the illumination opening diaphragm 41a by 90° in the XY plane is provided in the illumination opening diaphragm 41c. In addition, a selection opening 35c having a shape obtained by rotating the selection opening 35a provided in the diffracted light limiting diaphragm 31a by 90° in the XY plane is provided in the diffracted light limiting diaphragm 31c.

Accordingly, the selection opening 35c of the diffracted light limiting diaphragm 31c passes the $+1^{st}$ order diffracted light Dp1 and the $-1^{st}$ order diffracted light Dm1 from the measurement mark WM appropriate for measurement in the Y direction, and blocks the other rays of diffracted light (Dm2, Dp2, and the like). Accordingly, only the $+1^{st}$ order diffracted light Dp1 and the $-1^{st}$ order diffracted light Dm1 appropriate for detection of the measurement mark WM in the Y direction reaches the imaging surface 19s of the imaging part 19, and form the image IM of the measurement mark WM.

As described above, the illumination opening diaphragm 41a having the transmission opening 45a with a large width in the Y direction is used upon measurement in the X direction, and the illumination opening diaphragm 41c having the transmission opening 45c with a large width in the X direction is formed upon measurement in the Y direction.

However, even in any one of the measurement in the X direction and the measurement in the Y direction, instead of the illumination opening diaphragm 41a and the illumination opening diaphragm 41c, an illumination opening diaphragm 41b having a transmission opening 45b, in which both the width in the X direction and the width in the Y direction are narrow and which will be described below, may be used.

Further, as described above, by using the illumination opening diaphragm 41a or the illumination opening diaphragm 41c, the light quantity of the illumination light IL can be increased, S/N of the image IM can be improved, and improvement of measurement accuracy can be expected.

When the measurement mark WMa shown in FIG. 3(a) is measured, the measurement in the X direction and the measurement in the Y direction may be performed in sequence. Alternatively, in a state in which the illumination opening diaphragm 41b is inserted into the illumination optical path 20P such that a center 41bc of the illumination opening diaphragm 41b coincides with a center of the illumination optical path 20P and a diffracted light limiting diaphragm 311b is inserted into the image formation optical path 10P such that a center 31hc of the diffracted light limiting diaphragm 31b coincides with a center of the image formation optical path 10P, the measurements in the X direction and the Y direction may be simultaneously performed.

The transmission opening 45b with narrow widths in both the X direction and the Y direction is provided in the vicinity of the center 41bc of the illumination opening diaphragm 41b. Accordingly, the illumination light IL radiated to the measurement mark WMa enters at a narrow incidence angle range in the X direction and the Y direction.

For example, a range of the incidence angle of the illumination light IL passing through the transmission opening 45b to the measurement mark WM in the X direction and the Y direction is 0 or more and ⅓ or less as the above-mentioned coherence factor.

A selection opening 35b is provided in the diffracted light limiting diaphragm 31b at a position separated from the center 31bc in the ±X direction and the ±Y direction. A portion of the selection opening 35b separated from the center 31bc by the ±X direction pass the $+1^{st}$ order diffracted light Dp1 and the $-1^{st}$ order diffracted light Dm1 in the ±X direction from the −X side end portion LX and the +X side end portion RX of the measurement mark WMa due to radiation of the illumination light IL. Then, a portion of the selection opening 35b separated from the center 31bk in the ±Y direction passes the $+1^{st}$ order diffracted light Dp1 and the $-1^{st}$ order diffracted light Dm1 in the +Y direction generated from the central portion CY of the measurement mark WMa due to radiation of the illumination light IL.

In the diffracted light generated from the measurement mark WMa, the other diffracted light is blocked by the diffracted light limiting diaphragm 31b.

Accordingly, by using the illumination opening diaphragm 41b and the diffracted light, limiting diaphragm 31b, positions of the measurement mark WMa in the X direction and the Y direction shown in FIG. 3(a) can be accurately measured.

Further, when the X direction and the Y direction of the measurement mark WMa shown in FIG. 3(a) are simultaneously measured, the measurement may be performed using the illumination opening diaphragm 41d and the diffracted light limiting diaphragm 31d. That is, in a state in which the illumination opening diaphragm 41d is inserted into the illumination optical path 20P such that a center 41de of the illumination opening diaphragm 41d coincides with a center of the illumination optical path 20P and the diffracted light limiting diaphragm 31d is inserted into the image formation optical path 101 such that a center 31dc of the diffracted light limiting diaphragm 31d coincides with a center of the image formation optical path 10P, the measurement may be performed.

In this case, first, in a cross-shaped transmission opening 45d formed in the illumination opening diaphragm 41d, the illumination light IL passing through the vicinity of the end portion in the ±Y direction will be described. The $+1^{st}$ order diffracted light Dp1 and the $-1^{st}$ order diffracted light Dm1 in the X direction generated by radiating the illumination light IL to the $-$X side end portion LX and the $+$X side end portion RX of the measurement mark WMa pass through any one of the four selection openings 35$d$ provided in the diffracted light limiting diaphragm 31$d$. Then, the diffracted light of another order in the X direction and the diffracted light in the Y direction generated by the light radiated to the central portion CY of the measurement mark WMa are blocked by the diffracted light limiting diaphragm 31$d$.

Next, in the cross-shaped transmission opening 45$d$ formed in the illumination opening diaphragm 41$d$, the illumination light IL passing through the vicinity of the end portion in the ±X direction will be described. The $+1^{st}$ order diffracted light Dp1 and the $-1^{st}$ order diffracted light Dm1 in the Y direction generated by radiating the illumination light II, to the central portion CY of the measurement mark WMa pass through any one of the four selection openings 35$d$ provided in the diffracted light limiting diaphragm 31$d$. Then, the diffracted light of another order in the Y direction and the diffracted light in the Y direction generated by the light radiated to the $-$X side end portion LX and the $+$X side end portion RX of the measurement mark WMa are blocked by the diffracted light limiting diaphragm 31$d$.

Accordingly, even when the illumination opening diaphragm 41$d$ and the diffracted light limiting diaphragm 31$d$ are used, positions in the X direction and the Y direction of the measurement mark WMa shown in FIG. 3($a$) will be accurately measured.

Even in the measurement mark WMb shown in FIG. 3($b$), as described above, by using the illumination opening diaphragm 41$b$ and the diffracted light limiting diaphragm 31$b$ or using the illumination opening diaphragm 41$d$ and the diffracted light limiting diaphragm 31$d$, positions in the X direction and the Y direction can be accurately measured.

Further, even in the measurement mark WMb shown in FIG. 3($b$), the measurement in the X direction and the measurement in the Y direction may be performed in sequence.

Further, hereinabove, the diffracted light limiting diaphragms 31$a$ to 31$d$ selectively pass the $+1^{st}$ order diffracted light Dp1 and the $-1^{st}$ order diffracted light Dm1 from the measurement mark, and block the diffracted light of another order. However, the diffracted light selectively passing through the diffracted light limiting diaphragms 31$a$ to 31$d$ may be, for example, the $+2^{nd}$ order diffracted light Dp2 and the $-2^{nd}$ order diffracted light Dm2 or a $+3^{rd}$ order diffracted light and a $-3^{rd}$ order diffracted light (not shown).

in addition, in the plurality of rays of diffracted light limiting diaphragms 31$a$ to 31$d$, a diaphragm configured to selectively pass the $+1^{st}$ order diffracted light Dp1 and the $-1^{st}$ order diffracted light Dm1 and a diaphragm configured to selectively pass the $+2^{nd}$ order diffracted light Dp2 and the $-2^{nd}$ order diffracted light Dm2 are provided, and these may be switched by the selection switching part 33 and inserted into the image formation optical path 10P.

In addition, two rays of diffracted light passing through the diffracted light limiting diaphragms 31$a$ to 31$d$ are not limited to the pair of the rays of diffracted light with the same absolute value order, such as a $+m^{th}$ order diffracted light and a $-m^{th}$ order diffracted light with respect to a natural number in, and for example, may be a pair of rays of diffracted light with different orders of absolute values such as the $+1^{st}$ order diffracted light Dp1 and the $-2^{nd}$ order diffracted light Dm2. In addition, one of them may be a $0^{th}$ order diffracted light (regular reflection light).

In the viewpoints of telecentricity that the position measurement result of the measurement mark WM is not fluctuated even when the measuring target object W is raised or lowered in the Z direction, the diffracted light limiting diaphragms 31$a$ to 31$d$ may pass the two rays of diffracted light emitted symmetrically with respect to a surface perpendicular to the measurement direction. In other words, the diffracted light limiting diaphragms 31$a$ to 31$d$ may have each of the selection openings thereof provided line symmetry with respect to an axis passing through centers of the diffracted light limiting diaphragms 31$a$ to 31$d$ and perpendicular to the measurement direction.

Accordingly, as long as the illumination light IL enters substantially vertically the measuring target object W, in the viewpoints of telecentricity, the pair of the rays of diffracted light with the same absolute value of order may pass therethrough to form the image on the imaging part 19.

Meanwhile, when the illumination light IL enters the measuring target object W inclined at a predetermined angle from the vertical direction, for example, an angle corresponding to a half of the diffraction angle, of the $-1^{st}$ order diffracted light, it is preferable from the viewpoint of telecentricity to selectively pass, for example, the $0^{th}$ order diffracted light (regular reflection light) and the $+1^{st}$ order diffracted light.

Further, the illumination switching part 43 included in the illumination opening changing part 40 may change an incidence angle of the illumination light IL to the measuring target object W by shifting positions of all the illumination diaphragm holding part 42 and the illumination opening diaphragms 41$a$ to 41$d$ in the X direction and the Y direction.

Figure 5:
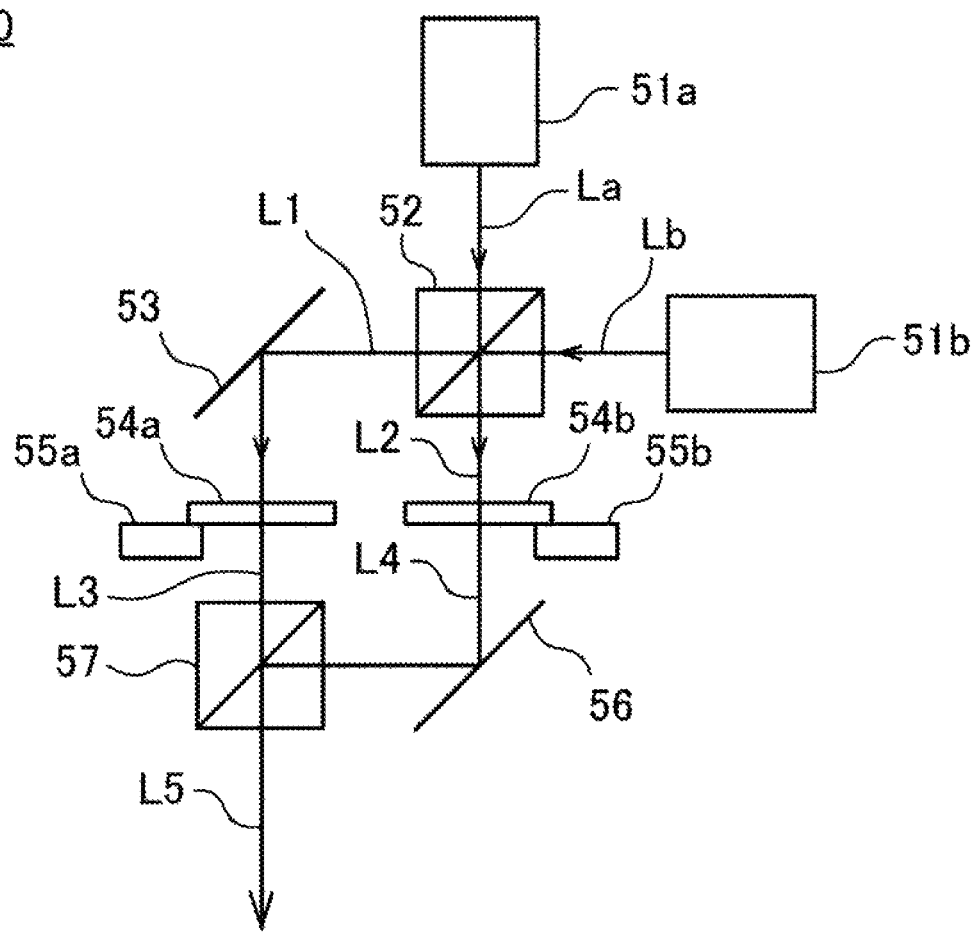
FIG. 5 is a view showing a light source.

FIG. 5 is a view showing an example of a configuration of the light source pan 50 of the measuring device 1. The light source part 50 of the example has a first light emitting part 51$a$ configured to emit first light La with a first wavelength, and a second light emitting part 51$b$ configured to emit second light Lb with a second wavelength. The first light emitting part 51$a$ and the second light emitting part 51$b$ may be members configured to emit light such as a laser, an LED, or the like, by itself, or may be members configured to emit light introduced from the outside of the emission end of the optical fiber. For example, the first light emitting part 51$a$ may be a laser, and the second light emitting part 51$b$ may be an LED.

The first light La and the second light Lb are mixed and separated by a polarization beam splitter 52. An S-polarized element of the first light La is reflected by the polarization beam splitter 52, and a P-polarized element of the second light Lb passes through the polarization beam splitter 52, thereby forming illumination light L1. A P-polarized element of the first light La passes through the polarization beam splitter 52, and an S-polarized element of the second light Lb is reflected by the polarization beam splitter 52, thereby forming illumination light L2.

The illumination light L1 is reflected by a mirror 53 and enters a phase modulation device 54$a$. The illumination light L2 enters a phase modulation device 54$b$ as it is. The phase modulation devices 54$a$ and 54$b$ are, for example, liquid crystal devices, and elements that function as wavelength plates according to voltages applied from voltage control parts 55$a$ and 55$b$. That is, the device functions as a 0 wavelength plate (flat plate) when a first voltage is applied to the voltage control parts 55$a$ and 55$b$, and functions as a ½ wavelength plate when a second voltage is applied.

The illumination lights L1 and L2 are converted into illumination lights L3 and L4 by the phase modulation devices 54a and 54b, respectively, by controlling polarization states thereof.

The illumination light L3 passing through the phase modulation device 54a enters a polarization type beam splitter 57. The illumination light L4 passing through the phase modulation device 54b is reflected by a mirror 56 and enters the beam splitter 57. Then, the illumination lights L3 and L4 are synthesized by the beam splitter 57, and emitted from the light source part 50 as illumination light L5.

In the light source part 50 of the above-mentioned example, lights with a plurality of different wavelengths can be simultaneously or individually emitted, and a polarization state of the emitted illumination light L5 can be changed by changing states of the phase modulation devices 54a and 54b.

In the case in which the first light emitting part 51a is a laser, when the above-mentioned diffracted light limiting diaphragm is used, the measurement mark WM may be irradiated with the first illumination light L1. Even when etendue of an image formation light flux is reduced by the diffracted light limiting diaphragm, since brightness of the image formation light flux is high, a sufficient light quantity can be secured in the imaging surface 19s. Meanwhile, when the measurement mark WM is irradiated with the second illumination light L2 using the second light emitting part 51b as the LED, the above-mentioned diffracted light limiting diaphragm may not be used. In this case, an image formation NA may be about 0.5 while an illumination NA is about 0.4.

Further, the light source part 50 of the measuring device 1 is not limited to the above-mentioned light source shown in FIG. 5, and any light source may be used as long as it is a light source having one or a plurality of light emitting parts, and a synthesizing pan configured to synthesize lights emitted from the light emitting parts according to necessity.

The light source part 50 may be configured to emit three or more lights with different wavelengths.

When the light source part 50 configured to emit lights with a plurality of wavelengths is used, diffraction angles of rays of diffracted light of each order from the measurement mark WM become angles different at each wavelength of the illumination light IL. Accordingly, positions of the rays of diffracted light (Dm2, Dm1, Dp1, Dp2, and the like) of each order on the diffracted light limiting diaphragms 31a to 31d are different at each wavelength of the illumination light IL. For this reason, in order to selectively pass a predetermined order of diffracted light of the light with a plurality of wavelengths through the selection openings 35a to 35d, the widths of the selection openings 35a to 35d in the measurement direction need to be expanded according to wavelength widths of the plurality of used wavelengths.

Figure 6:
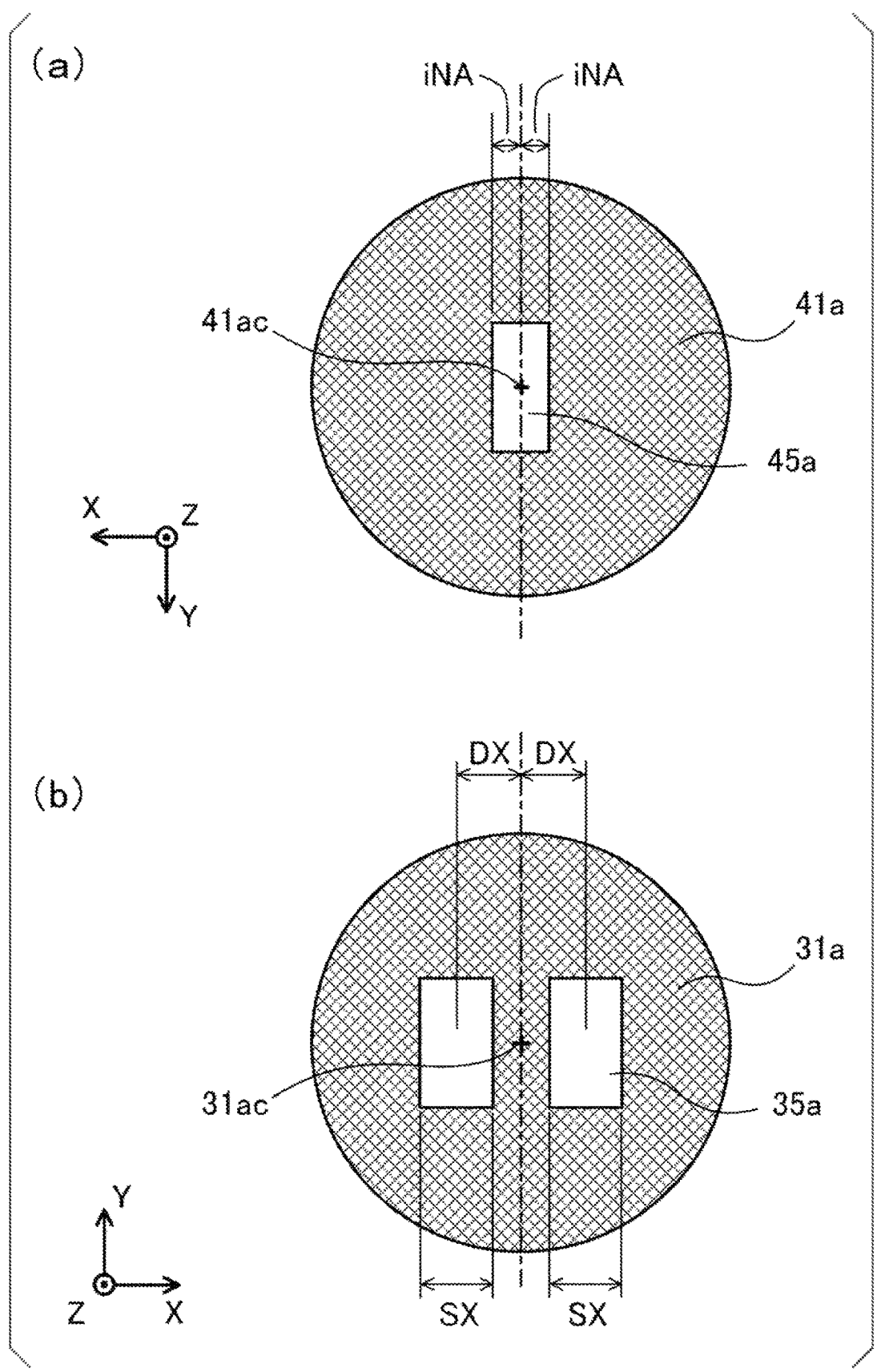
FIG. 6($a$) is a view showing an example of a size of a transmission opening provided in an illumination opening changing part.

FIG. 6(a) is a view showing an example of a size of the transmission opening 45a provided in the illumination opening diaphragm 41a when the light source part 50 configured to emit lights with a plurality of wavelengths is used, and FIG. 6(b) is a view showing an example of a size of the selection opening 35a provided in the diffracted light limiting diaphragm 31a.

Here, the light source part 50 is configured to emit light with a wavelength from a minimum wavelength where a wavelength is λ1 to a maximum wavelength where a wavelength is λ2, and measure the measurement mark WM having the period PX in the X direction shown in FIG. 2(a).

Further, the illumination opening diaphragm 41a is provided on the pupil surface of the illumination system 20 and the vicinity thereof, and the diffracted light limiting diaphragm 31a is provided on the pupil surface of the image formation system 10 and the vicinity thereof. Here, in FIG. 6(a) and FIG. 6(b), XY coordinates in the drawings will be described as corresponding to a sine of an incidence angle of the illumination light IL, to the measuring target object W or a sine of an emission angle of the diffracted light (Dm2, Dm1. Dp1. Dp2, or the like) from the measuring target object W.

As shown in FIG. 6(a), a half width of the transmission opening 45a in the X direction is set to iNA, and the entire width of the transmission opening 45a in the X direction is set to 2×iNA. Further, a center position of the transmission opening 45a in the X direction coincides with the center 41ac of the illumination opening diaphragm 41a.

As shown in FIG. 6(b), the selection opening 35a is disposed in the diffracted light limiting diaphragm 31a at a position separated from the center 31ac of the diffracted light limiting diaphragm 31a in the X direction by DX in each of the +X direction and the −X direction. Here, a value of the DX is (λ1+λ2)/(2×PX), and corresponds to a sine of the diffraction angles of the ±1$^{st}$ order rays of diffracted light generated when the light with a substantially intermediate wavelength between the above mentioned minimum wavelength (λ1) and the maximum wavelength (λ2) is radiated to the measurement mark WM having the period PX.

Then, a width of each of the selection opening 35a in the X direction is referred to as SX, and the SX may be provided to satisfy Equation (1).

$$SX < (3 \times \lambda 1 - \lambda 2)/PX - 2 \times iNA \tag{1}$$

Accordingly, the selection opening 35a can pass the +1$^{st}$ order diffracted light Dp1 and the −1$^{st}$ order diffracted light Dm1 of the illumination light L, from the minimum wavelength (λ1) to the maximum wavelength (λ2), and can introduce the lights into the imaging part 19. Meanwhile, the diffracted light limiting diaphragm 31a blocks another order of diffracted light (Dm2. Dp2, or the like).

Further, even in the case, the selection opening 35a may selectively pass two rays of diffracted light of the other orders such as a +m$^{th}$ order diffracted light and a −m$^{th}$ order diffracted light, and the like, instead of selectively passing the +1" order diffracted light Dp1 and the −1$^{st}$ order diffracted light Dm1. In this case, the SX may satisfy a condition of Equation (2), instead of Equation (1).

$$SX < (m+2) \times \lambda 1 - m \times \lambda 2)/PX - 2 \times iNA \tag{2}$$

Further, when the minimum wavelength (λ1) and the maximum wavelength (λ2) are greatly different from each other, in the above-mentioned method, it is difficult for the selection opening 35a to selectively pass only the +1$^{st}$ order diffracted light Dp1 and the −1$^{st}$ order diffracted light Dm1.

However, according to the range of about λ1<λ2≤2×λ1, it is possible for the selection opening 35a expanded in the X direction to selectively pass only the +1$^{st}$ order diffracted light Dp1 and the −1$^{st}$ order diffracted light Dm1.

Further, for example, when the shape of the measurement mark WM is set such that intensity in diffracted light of an even number order is sufficiently smaller than diffracted light of an odd number order, it is possible for the selection opening 35a expanded in the X direction to selectively pass rays of diffracted light of desired two orders within a range of about λ1<λ2≤3×λ1.

Further, when the measurement in the Y direction is performed, the illumination opening diaphragm 41a and the diffracted light limiting diaphragm 31a shown in FIG. 6(a) and FIG. 6(b) may be used after being rotated by 90° in the XY plane.

Further, in the above-mentioned example, the diffracted light restricting part 30 includes the plurality of rays of diffracted light limiting diaphragms 31a to 31d having the selection openings 35a to 35d with different shapes, and the selection switching part 33 selects them and inserts then into the image formation optical path 10P. However, the configuration of the diffracted light restricting part 30 is not limited thereto, and for example, a configuration having a plurality of movable blades and configured to change a position and a form of a selection opening as the selection switching part 33 moves a position of each movable blade may be provided.

Similar to the illumination opening changing part 40, for example, a configuration having a plurality of movable blades and configured to change a position and a form of a transmission opening as the illumination switching part 43 moves a position of each movable blade may be provided.

In addition, instead of blocking some of the illumination light IL using the illumination opening diaphragms 41a to 41d, an optical member configured to condense the illumination light IL at positions corresponding to the transmission openings 45a to 45d may be used.

Further, the illumination opening changing part 40 may also be referred to as a diffracted light passing part.

Further, hereinabove, the image formation system 10 has the intermediate image formation surface MP, and the index board 15 is disposed on the intermediate image formation surface MP. However, when mechanical rigidity or temperature stability of the image formation system 10 is good, for example, since a predetermined imaging pixel of the imaging part 19 can be used as a measurement reference position of the image formation system 10, the index board 15 may not be necessarily disposed. Accordingly, the intermediate image formation surface MP for disposition of the index board 15 may be not formed.

Further, by disposing the index board 15, on which the position index 16 is provided, on the intermediate image formation surface MP, even when mechanical or thermal deformation occurs in the image formation system 10, there is an effect capable of measuring the position of the measurement mark WM accurately.

(Effects of measuring device of first embodiment)

(1) The measuring device of the above-mentioned first embodiment includes the illumination system 20 configured to radiate light (the illumination light IL) to the measuring target object W located on the object plane OP, the image formation systems 10, 10a and 10b configured to form the conjugate plane CP optically conjugated with the object plane 0P, the diffracted light restricting part 30 configured to restrict at least some of the plurality of rays of diffracted light (Dm2, Dm1, Dp1, Dp2, and the like) from the measuring target object W and to pass the first diffracted light (the +1$^{st}$ order diffracted light Dp1 or the like) of the plurality of rays of diffracted light and the second diffracted light (the −1$^{st}$ order diffracted light Dm1 or the like) different from the first diffracted light, and the imaging part 19 disposed on the conjugate plane CP and configured to image a periodical light and dark pattern (the image IM) formed by the first diffracted light and the second diffracted light.

According to the above-mentioned configuration, the image formation systems 10, 10a and 10b are less affected by the wave aberration, and accurate position measurement can be performed.

(Variant 1 of measuring device)

Figure 7:
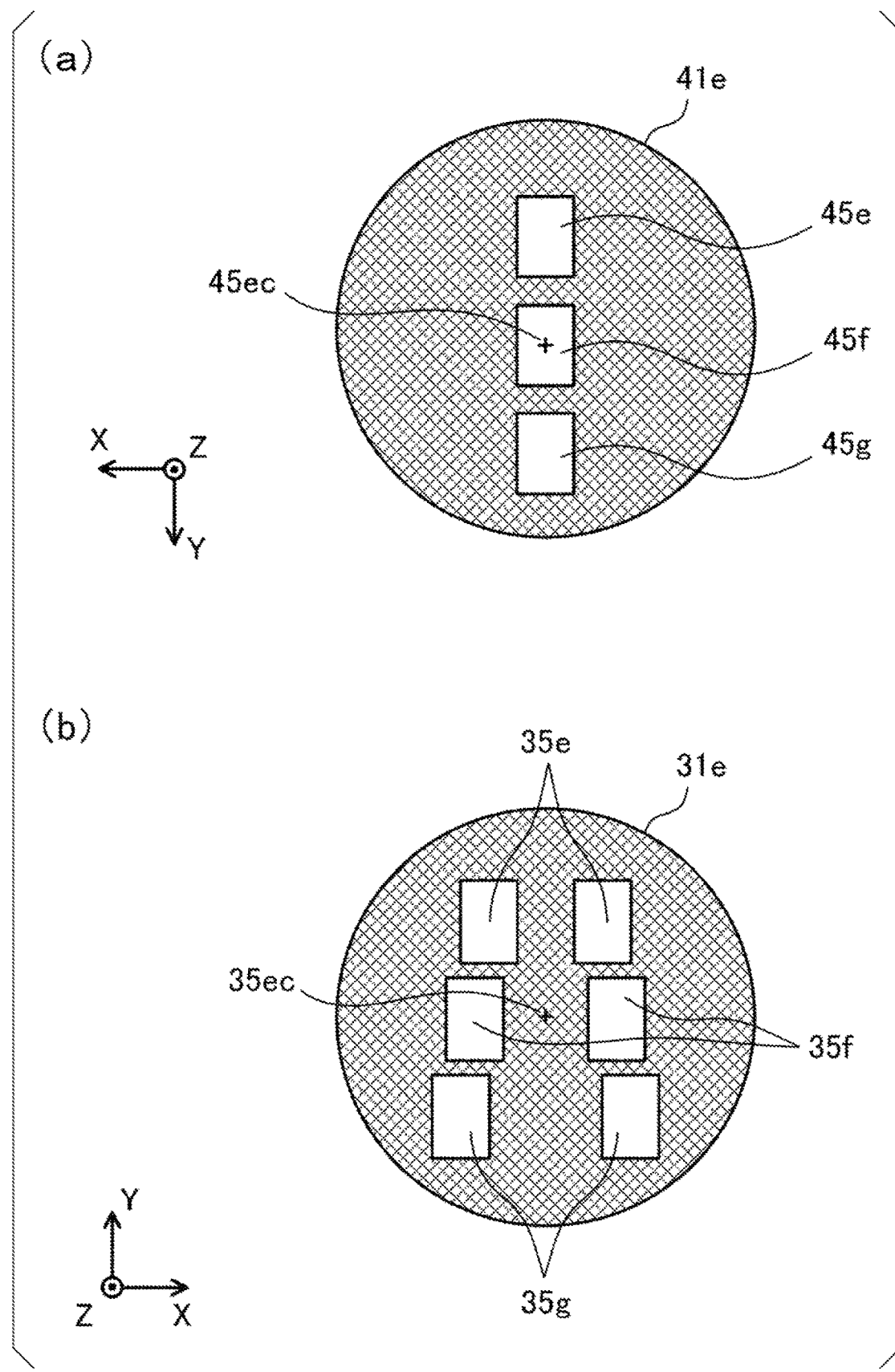
FIG. 7($a$) is a view showing an example of an illumination opening diaphragm of Variant 1 of the measuring device.

In Variant 1 of the measuring device, together with using the light source part 50 that emits lights with a plurality of wavelength, instead of at least some of the diffracted light limiting diaphragms 31a to 31d shown in FIG. 4(b), a diffracted light limiting diaphragm 31e shown in FIG. 7(b) is used. In addition, instead of at least, some of the illumination opening diaphragms 41a to 41d shown in FIG. 4(a), an illumination opening diaphragm 41e shown in FIG. 7(a) is used.

Even in Variant 1 of the measuring device, since the configuration except the diffracted light limiting diaphragm e and the illumination opening diaphragm 41e is the same as the measuring device 1 of the above-mentioned first embodiment, description of the same configuration will be omitted.

In the illumination opening diaphragm 41e shown in FIG. 7(a), a transmission opening 45f in the vicinity of a center 45ec, a transmission opening 45e at a position separated from the center 45ee in the −Y direction, and a transmission opening 45g at a position separated from the center 45ec in the +Y direction are provided.

The transmission opening 45f passes light with a first wavelength in the light include in the illumination light IL. The transmission opening 45e passes light with a second wavelength smaller than the first wavelength of the light included in the illumination light IL. Then, the transmission opening 45g passes light with a third wavelength greater than the first wavelength of the light included in the illumination light IL.

The illumination light IL passing through any one of the transmission openings 45e, 45f and 45g is guided to the lenses 22 and 24, the mirror 23, and the divergence mirror 25, and radiated to the measurement mark WM. The light with the first wavelength passing through the transmission opening 45f enters the measurement mark WM from substantially vertically above. The light with the second wavelength passing through the transmission opening 45e enters the measurement mark WM from a direction inclined in the −Y direction with respect to a vertical direction according to an image formation action of the lenses 22 and 24. In addition, the light with the second wavelength passing through the transmission opening 45g enters the measurement mark WM from a direction inclined in the +Y direction with respect to the vertical direction.

An emission angle of the diffracted light generated from the measurement mark WM is shifted according to the wavelength by shifting incidence angles of the plurality of illumination lights IL having different wavelengths to the measurement mark W M in the Y direction. Accordingly, the position where the diffracted light of each order in the diffracted light limiting diaphragm 31e is condensed can be shifted for each wavelength in the Y direction.

Here, in the diffracted light limiting diaphragm 31e shown in FIG. 7(b), selection openings 35e, 35f and 35g disposed to form a pair in the X direction are provided at different positions in the Y direction. An interval between the two selection openings 35e in the X direction is smaller than an interval between the two selection openings 35f in the X direction, and an interval between the two selection openings 35g in the X direction is greater than an interval between the two selection openings 35f in the X direction.

When the measurement mark WM shown in FIG. 2(a) is measured, the illumination light IL with the first wavelength passing through the transmission opening 45f enters the measurement mark WM substantially vertically, and the +1$^{st}$ order diffracted light Dp1 and the −1$^{st}$ order diffracted light Dm1 pass through the selection opening 35f of the diffracted light limiting diaphragm 31e to reach the imaging part 19.

The illumination light IL with the second wavelength passing through the transmission opening 45e enters the measurement mark WM from the direction inclined in the −Y direction, and the +1$^{st}$ order diffracted light Dp1 and the −1$^{st}$ order diffracted light Dm1 pass through the selection opening 35e of the diffracted light limiting diaphragm 31e and reach the imaging part 19.

The illumination light IL with the third wavelength passing through the transmission opening 45g enters the measurement mark WM from the direction inclined in the +Y direction, and the +1$^{st}$ order diffracted light Dp1 and the −1$^{st}$ order diffracted light Dm1 pass through the selection opening 35g of the diffracted light limiting diaphragm 31e and reach the imaging part 19.

Accordingly, in Variant 1 of the measuring device, the diffracted light limiting diaphragm 31e and the illumination opening diaphragm 41e can selectively pass the +1$^{st}$ order diffracted light Dp1 and the −1$^{st}$ order diffracted light Dm1 from the measurement mark WM even when the light source part 50 configured to emit the light with the plurality of wavelengths is used. Accordingly, a good image of the measurement mark WM can be formed on the imaging part 19. The light source part 50 may simultaneously emit the light with the plurality of different wavelengths (the light with the first wavelength to the light with the third wavelength).

Alternatively, the wavelength of the light emitted at every predetermined time may differ. That is, the light with the first wavelength is radiated for a first duration, and the light with the second wavelength may be radiated for a second duration different from the first duration. In this case, the imaging part 19 can individually image the image of the measurement mark WM for each of the different wavelengths by performing the imaging for each of the first duration and the second duration. Accordingly, the position of the measurement mark WM is individually measured for each of the different wavelengths, statistical processing such as averaging or the like is performed on the measurement results thereof, and thus, the measurement can be more accurately performed.

In addition, spectroscopy may be performed in a non-measurement direction at the position of the intermediate image formation surface MP.

Further, when the Y position of the mark appropriate for measurement in the Y direction obtained by rotating the measurement mark WM shown in FIG. 2(a) by 90° in the XY plane is measured, the diffracted light limiting diaphragm and the illumination opening diaphragm having the shapes obtained by rotating the diffracted light limiting diaphragm 31e and the illumination opening diaphragm 41e by 90° may be used.

(Effects of Variant 1 of Measuring Device)

(2) Variant 1 of the above-mentioned measuring device includes the illumination system 20 configured to radiate the lights with the plurality of wavelengths to the measuring target object W located on the object plane OP, the image formation system 10 configured to form the conjugate plane CP optically conjugated with the object plane OP, the diffracted light passing part (the diffracted light restricting part 30) configured to pass the first diffracted light (the +1$^{st}$ order diffracted light Dp1 or the like) and the second diffracted light (the −1$^{st}$ order diffracted light Dm1 or the like) different from the first diffracted light among the plurality of rays of diffracted light (Dm2, Dm1, Dp1, Dp2, and the like) from the measuring target object W, and the imaging part 19 disposed on the conjugate plane CP and configured to image the light and dark pattern (the image IM) of the measuring target object W formed by the lights with the plurality of wavelengths passing through the diffracted light passing part.

According to the configuration, the same effect as the measuring device 1 of the above-mentioned first embodiment is provided, and an effect of performing the measurement more accurately is obtained by using the lights with the plurality of wavelengths. For example, due to a step difference of a concavo-convex portion of the measurement mark, it is effective when the image contrast of the measurement mark is good at a certain wavelength but the image contrast of the measurement mark is weak at another wavelength.

(Variant 2 of Measuring Device)

Hereinafter, Variant 2 of the measuring device 1 will be described. Since a configuration of Variant 2 of the measuring device 1 is almost the same as the configuration of the measuring device 1 or Variant 1 of the above-mentioned first embodiment, only a difference from the measuring device 1 or Variant 1 of the first embodiment will be described below, the same components are designated by the same reference signs, and detailed description thereof will be omitted as appropriate.

Figure 8:
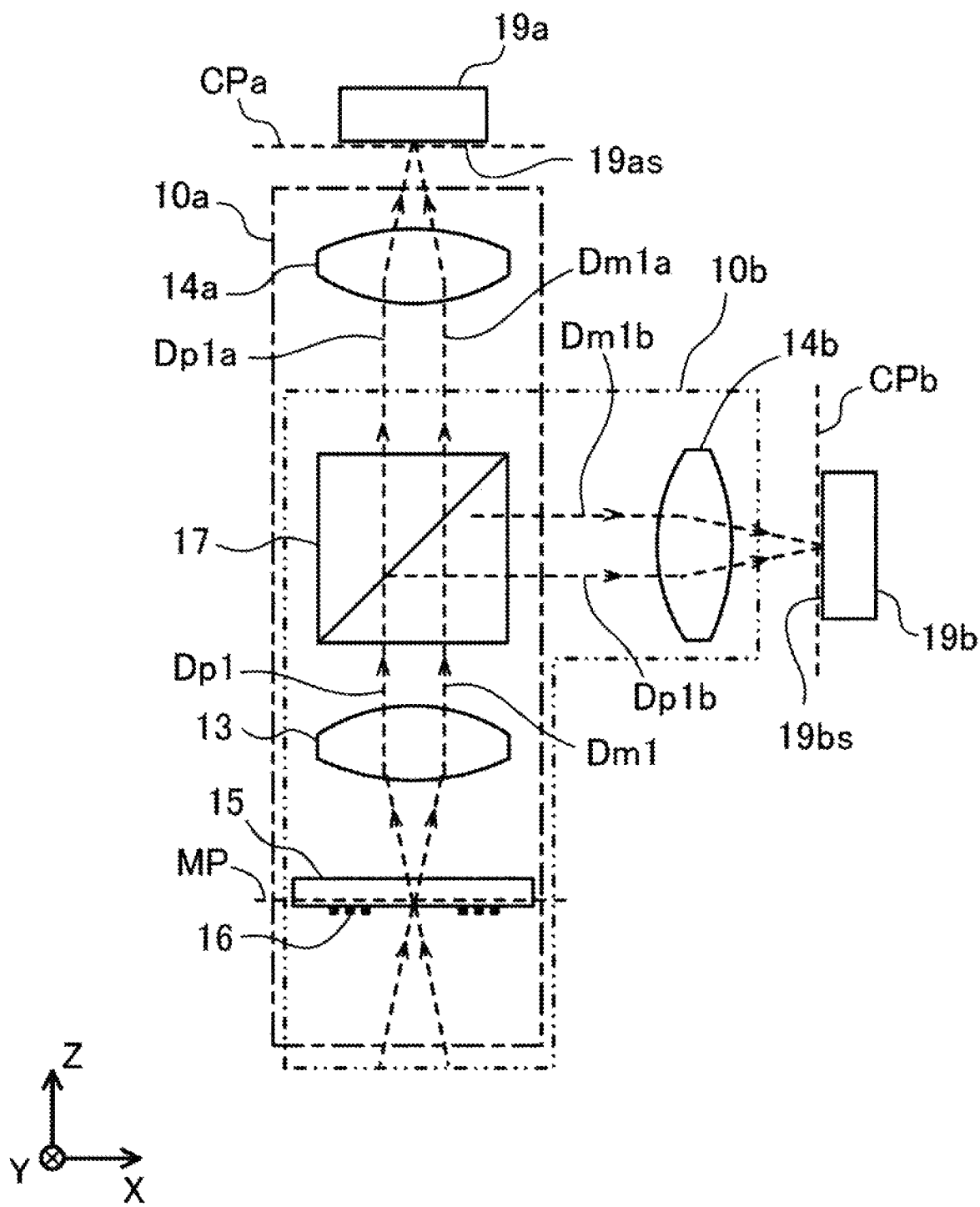
FIG. 8 is a view schematically showing a part of a configuration of Variant 2 of the measuring device.

FIG. 8 is a view schematically showing a portion of the measuring device 1 of Variant 2 corresponding to the image formation system 10 after the index board 15 of the measuring device 1 of the above-mentioned first embodiment. In Variant 2, a beam splitter 17 is disposed between the second relay lens 13 and the third relay lens 14a. Accordingly, each of rays of diffracted light such as the +1$^{st}$ order diffracted light Dp1, the −1$^{st}$ order diffracted light Dm1 and the like, is divided into two rays of lights by the beam splitter 17.

One (Dp1a, Dm1a) of the divided rays of diffracted light, goes straight through the beam splitter 17, is condensed by the third relay lens 14a, and forms the image IM of the measurement mark W M on an imaging surface 19as of a first imaging part 19a. The other (Dp1b, Dm1b) of the divided rays of diffracted light is reflected by the beam splitter 17, is condensed by the third relay lens 14b, and forms the image IM of the measurement mark WM on an imaging surface 19bs of a second imaging part 19b.

The optical system from the objective lens 11 (see FIG. 1) to the third relay lens 14a via the index board 15, the beam splitter 17, and the like, constitute one image formation system 10a. Similarly, the optical system from the objective lens 11 to the third relay lens 14b via the index board 15, the beam splitter 17, and the like, constitute another image formation system 10b. That is, the measuring device 1 of Variant 2 has the plurality of image formation systems 10a and 10b.

The imaging surface 19as of the first imaging part 19a is disposed in the vicinity of the conjugate plane CPa with respect to the object plane OP of the image formation system 10a. The imaging surface 19bs of the second imaging pan 19b may be disposed in the vicinity of the conjugate plane CPb with respect to the object plane OP of the image formation system 10b.

However, a positional shift amount of the imaging surface 19as with respect to the conjugate plane CPa in the Z direction is different from a positional shift amount of the imaging surface 19bs with respect to the conjugate plane CPb in the X direction.

In other words, a relative position in a direction crossing the conjugate plane CPa of the imaging surface 19as of the first imaging part 19a with respect to the conjugate plane CPa is different from a relative position in a direction crossing the conjugate plane CPb of the imaging surface 19bs of the second imaging part 19b with respect to the conjugate plane CPb.

Accordingly, in the measuring device 1 of Variant 2, for example, the image formed on the imaging surface 19as has a contrast better than the measurement mark WM disposed on the object plane OP and at a position shifted from the object plane OP in the −Z direction. Meanwhile, the image formed on the imaging surface 19bs has a contrast better than the measurement mark WM disposed on the object plane OP and a position shifted from the object plane OP in the +Z direction.

As a result, even when the measurement mark WM is disposed to be shifted from the object plane OP in the Z direction, a good image of the measurement mark WM is detected by any one of the plurality of image formation systems 10a and 10b, and as a result, the measurement mark WM can be accurately measured.

Hereinabove, while the example in which the two image formation systems 10a and 10b are included has been described, three image formation systems may be provided by disposing the plurality of beam splitters 17 in series or the like.

In addition, a position where the beam splitter 17 configured to divide the optical path of the plurality of image formation systems 10a and 10b is disposed is not limited to between the second relay lens 13 and the third relay lens 14. The beam splitter 17 configured to divide the optical path may be disposed, for example, closer to the objective lens 11 than the index board 15, or may be disposed closer to the objective lens 11 than the diffracted light restricting part 30. In these cases, the index board 15 or the diffracted light restricting part 30 may be disposed in each of the plurality of image formation systems 10a and 10b.

Figure 9:
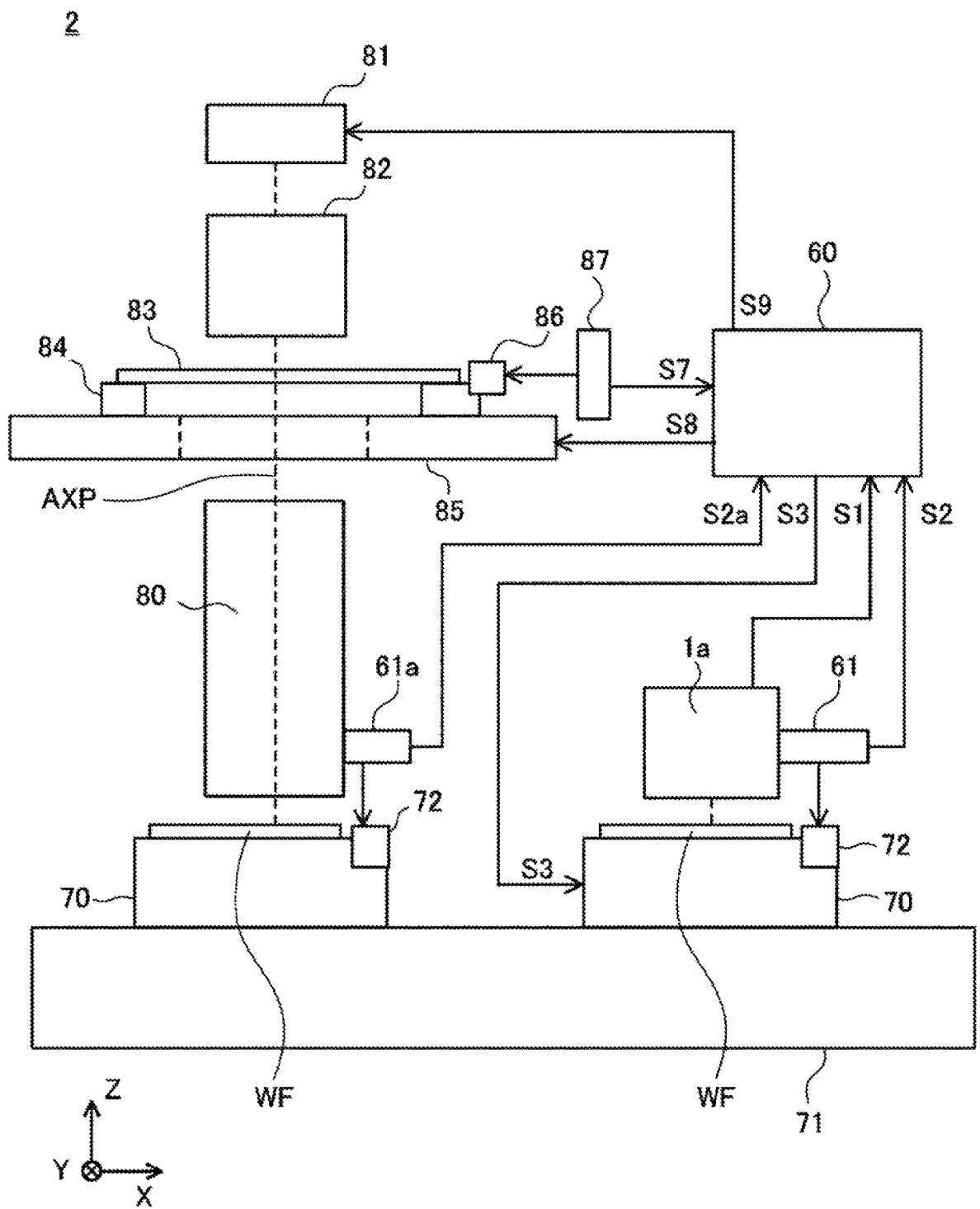
FIG. 9 is a view schematically showing a configuration of an exposure device of a second embodiment.

(Exposure device of second embodiment) FIG. 9 is a view schematically showing an exposure device 2 of a second embodiment. The exposure device 2 of the second embodiment is an exposure device configured to expose and transfer a light and dark pattern on a photoresist (not shown) formed on a surface (a +Z side surface) of a semiconductor wafer or a substrate for a display device (hereinafter, both are referred to as "a substrate") WF.

The exposure device 2 includes a part of the measuring device 1 of the first embodiment or the variant as the measuring device 1a. The measuring device 1a is a part of the measuring device 1 of the first embodiment or the variant including the image formation system 10, the illumination system 20, the diffracted light restricting part 30, the imaging part 19 and the light source part 50. Further, since the configurations and functions of the control part 60, the sampling stage 70, the guide 71, the scale board 72, and the encoder 61 of the exposure device 2 are the same as the configurations and functions included in the measuring device 1 of the first embodiment or the variant, description thereof will be omitted as appropriate.

The measuring device 1 treats a substrate WF as the measuring target object W, and measures a position of the measurement mark WM (see FIG. 1 and not shown in FIG. 9) formed on the surface of the substrate WF.

The substrate WF loaded into the exposure device 2 is placed on the sampling stage 70 movable on the guide 71, and disposed below the measuring device 1a according to movement of the sampling stage 70. The control part. 6 sends the control signal S3 and moves the sampling stage 70 in the XY plane, the measurement marks WM disposed at a plurality of places on the surface of the substrate WF are disposed directly under the image formulation system 10 of the measuring device 1a in sequence, and the positions of the measurement marks WM are measured by the method described above.

The control part 60 creates map data related to the X position and the Y position of an existing circuit pattern on the substrate WF on the basis of the information related to a positional relation between the measurement mark WM and the existing circuit pattern, which are already known, and a position of the measurement mark WM measured by the measuring device 1a.

Then, the control part 60 moves the sampling stage 70 in the XY plane such that the substrate WF is disposed below an exposure optical system 80, and performs exposure to the photoresist (not shown) formed on the surface of the substrate WF. The exposure may be step exposure or may be scan exposure.

The X position and the Y position of the sampling stage 70 during the exposure are measured by the encoder 61a held integrally with the exposure optical system 80 via a position of the scale board 72 provided on the sampling stage 70, and transmitted to the control part 60 as the position signal S2a. The control part 60 controls the X position and the Y position of the sampling stage 70 on the basis of the position signal S2a and the above-mentioned map data.

In the above-mentioned exposure operation, the illumination light from an exposure light source 81 is radiated to a master copy (mask pattern) drawn on a mask 83 via an exposure illumination system 82. As a result, the image of the master copy is projected to the photoresist (not shown) on the substrate WF via the exposure optical system 80 disposed on an exposure light path AXP, and the light and dark pattern is exposed to the photoresist.

When the exposure operation is the scan exposure, the exposure optical system 80 is synchronized with the mask 83 and the substrate WF and is relatively scanned during the exposure operation. For this scanning, the mask 83 is placed on a mask stage 84, and the mask stage 84 is movable on a mask surface table 85 in the X direction. A position of the mask stage 84 is measured by an interferometer 87 via a position of a reference mirror 86.

When the exposure operation is the step exposure, the sampling stage 70 is stopped during exposure of one shot, and the sampling stage 70 is moved by a predetermined distance in the X direction or the Y direction between each shot.

The exposure optical system 80 may be optical system for liquid immersion in which a liquid is disposed between the exposure optical system 80 and the substrate WF. Alternatively, the exposure device 2 is not limited to a device configured to perform exposure using light or ultraviolet light or may be a device configured to perform exposure using an electron beam or an X ray.

The exposure device 2 includes the plurality of measuring devices 1a, and may simultaneously measure the plurality of measurement marks WM on the substrate WF.

(Effects of exposure device of second embodiment)

(3) The exposure device 2 of the second embodiment includes the measuring device of the above-mentioned first embodiment. Variant 1 or Variant 2, and the exposure optical system 80 configured to radiate exposure light to the substance including the measuring target object W (the substrate WF).

According to the configuration, the position of the measurement mark WM formed on the substrate WF can be accurately measured, and thus, the light and dark pattern can be exposed by accurately matching the position with the existing circuit pattern formed on the substrate WF.

(Other variants)

Figure 10:
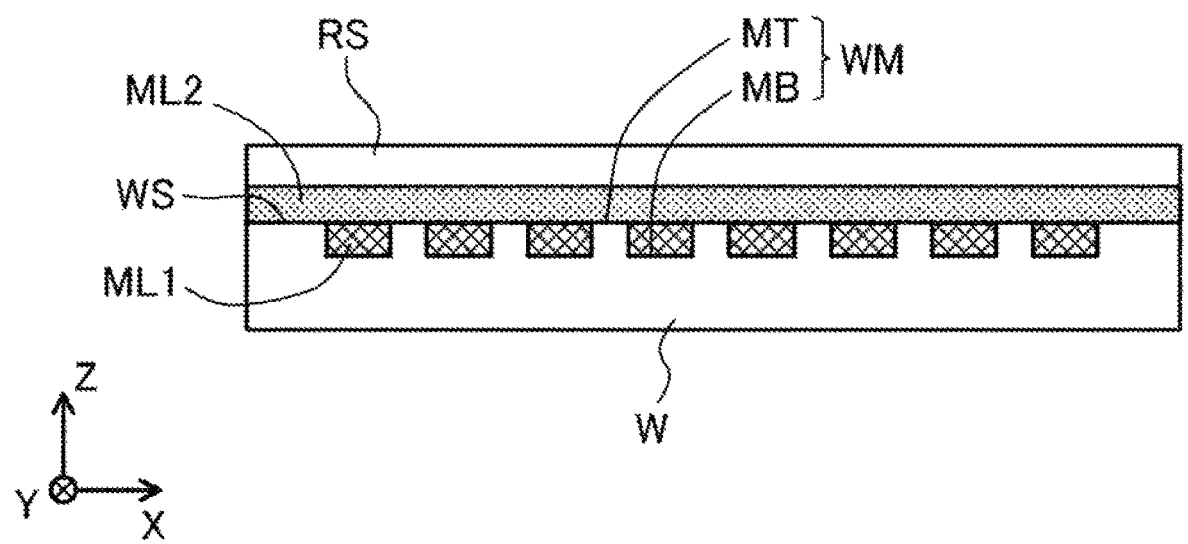
FIG. 10 is a view showing an example of a position measurement mark according to the variant.

In the above-mentioned description, as shown in FIG. 2(b), the surface WS of the measuring target object W is directly covered with the film RS. However, as shown in FIG. 10, a configuration in which the depressed section MB of the measurement mark WM of the measuring target object W is filled with a first type of medium ML1, above it is covered with a second type of medium MU different from the first type of medium, and the film RS is formed above of the second type of medium ML2 may be provided. Here, the film thickness of the second type of medium ML2 may change depending on the process. The contrast of the image of the measurement mark WM formed on the imaging surface 19s is varied according to the change of the film thickness of the medium ML2. In this case, mark measurement may be performed using illumination light with a wavelength band that has a good contrast of the image of the measurement mark WM.

The present invention is not limited to the above-mentioned contents. The other aspects considered within the range of the technical scope of the present invention are also included in the range of the present invention. The embodiment may be a combination of all or some of the above-mentioned aspects.

REFERENCE SIGNS LIST 1, 1a: measuring device, 10, 10a, 10b: image formation system, II: objective lens, 15: index board, 16: position index, 19: imaging part, OP: object plane. CP: conjugate plane, MP: intermediate image formation surface, 20: illumination system, 40: illumination opening changing part. 41a to 41e: illumination opening diaphragm. 30: diffracted light restricting part, 31a to 31e: diffracted light limiting diaphragm. 33: selection switching part. 50: light source part, 60: control pan. W: the measuring target object W, WM. WMa. WMb: measurement mark, 2: exposure device, 80: exposure optical system. 81: exposure light source, 82: exposure illumination system

The invention claimed is:

1. A measuring device comprising:
an illumination system configured to radiate light with a plurality of wavelengths to a measuring target object located on an object plane;
an image formation system configured to form a conjugate plane optically conjugated with the object plane;
a diffracted light restricting part configured to restrict at least some of a plurality of rays of diffracted light from the measuring target object and to pass first diffracted light and second diffracted light different from the first diffracted light among the plurality of rays of diffracted light; and
an imaging part disposed on the conjugate plane and configured to image a periodic light and dark pattern formed by the first diffracted light and the second diffracted light, wherein
the diffracted light restricting part passes the first and second diffracted light for each wavelength.

2. The measuring device according to claim 1, wherein the diffracted light restricting part has a selection switching part configured to switch the first diffracted light and the second diffracted light, which is made to pass therethrough, among the plurality of rays of diffracted light from the measuring target object.

3. The measuring device according to claim 1, wherein the first diffracted light is diffracted light of a $+m^{th}$ order (m is a natural number), and
the second diffracted light is diffracted light of a $-m^{th}$ order.

4. The measuring device according to claim 1, wherein the first diffracted light and the second diffracted light are diffracted light emitted symmetrically to a surface perpendicular to a direction in which the measuring target object is measured.

5. The measuring device according to claim 1, wherein a coherence factor of the light, which is radiated from the illumination system to the measuring target object, with respect to the image formation system is 0 or more and ⅓ or less.

6. The measuring device according to claim 1, wherein the illumination system has an illumination opening changing part configured to change a coherence factor of the light, which is radiated to the measuring target object, with respect to the image formation system.

7. The measuring device according to claim 1, wherein the illumination system has a deflection member configured to change an incidence angle of the light with respect to the measuring target object.

8. The measuring device according to claim 1, wherein the image formation system has an intermediate image formation surface between the measuring target object and the conjugate plane, and a position index on the intermediate image formation surface, and
the imaging part images an image of the position index formed on the conjugate plane together with the light and dark pattern.

9. The measuring device according to claim 1, wherein the measuring target object formed on a substrate surface is detected, the image formation system and the imaging part are provided in plural, and
a relative position of the imaging part with respect to the conjugate plane in each of the plurality of image formation systems differs in a direction crossing the conjugate plane.

10. An exposure device comprising:
the measuring device according to claim 1; and
an exposure optical system configured to radiate exposure light to a substance including the measuring target object.

11. A measurement method using the measuring device according to claim 1, the method comprising measuring a position of a mark having a periodic structure.

12. A measuring device comprising:
an illumination system configured to radiate light with a plurality of wavelengths to a measuring target object located on an object plane;
an image formation system configured to form a conjugate plane optically conjugated with the object plane;
a diffracted light restricting part configured to restrict at least some of a plurality of rays of diffracted light from the measuring target object and to pass first diffracted light and second diffracted light different from the first diffracted light among the plurality of rays of diffracted light; and
an imaging part disposed on the conjugate plane and configured to image a periodic light and dark pattern formed by the first diffracted light and the second diffracted light, wherein
a first duration, in which light with a first wavelength among the light with the plurality of wavelengths is radiated, is different from a second duration, in which light with a second wavelength among the light with the plurality of wavelengths is radiated.

13. A measuring device comprising:
an illumination system configured to radiate light with a plurality of wavelengths to a measuring target object located on an object plane;
an image formation system configured to form a conjugate plane optically conjugated with the object plane;
a diffracted light passing part configured to pass first diffracted light and second diffracted light different from the first diffracted light among a plurality of rays of diffracted light from the measuring target object; and
an imaging part disposed on the conjugate plane and configured to image a light and dark pattern formed by the light with the plurality of wavelengths passed through the diffracted light passing part, wherein
a first duration, in which light with a first wavelength among the light with the plurality of wavelengths is radiated, is different from a second duration, in which light with a second wavelength among the light with the plurality of wavelengths is radiated.

14. The measuring device according to claim 13, wherein the diffracted light passing part restricts at least some of the plurality of rays of diffracted light from the measuring target object.

15. An exposure device comprising:
the measuring device according to claim 13; and
an exposure optical system configured to radiate exposure light to a substance including the measuring target object.

16. A measurement method using the measuring device according to claim 13, the method comprising measuring a position of a mark having a periodic structure.

17. A measuring device comprising:
an illumination system configured to radiate light with a plurality of wavelengths to a measuring target object located on an object plane;
an image formation system configured to form a conjugate plane optically conjugated with the object plane;
a diffracted light passing part configured to pass first diffracted light and second diffracted light different from the first diffracted light among a plurality of rays of diffracted light from the measuring target object; and
an imaging part disposed on the conjugate plane and configured to image a light and dark pattern formed by the light with the plurality of wavelengths passed through the diffracted light passing part, wherein
the diffracted light passing part restricts at least some of the plurality of rays of diffracted light from the measuring target object, and
the diffracted light passing part passes the first and second diffracted light generated from the measuring target object by light with a first wavelength among the plurality of wavelengths, and passes the first and second diffracted light generated from the measuring target object by light with a second wavelength different from the first wavelength among the plurality of wavelengths.

* * * * *